US006741192B2

United States Patent
Murata et al.

(10) Patent No.: US 6,741,192 B2
(45) Date of Patent: May 25, 2004

(54) A/D CONVERSION METHOD FOR SERIAL/PARALLEL A/D CONVERTER, AND SERIAL/PARALLEL A/D CONVERTER

(75) Inventors: Kenji Murata, Katano (JP); Daisuke Nomasaki, Ibaraki (JP)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 10/615,391

(22) Filed: Jul. 9, 2003

(65) Prior Publication Data
US 2004/0017305 A1 Jan. 29, 2004

(30) Foreign Application Priority Data
Jul. 9, 2002 (JP) ........................................ 2002-199688

(51) Int. Cl.[7] .............................................. H03M 9/00
(52) U.S. Cl. ..................... 341/100; 341/555; 341/156
(58) Field of Search ................................ 341/100, 155, 341/156, 158, 159, 118, 161

(56) References Cited

U.S. PATENT DOCUMENTS

| 5,019,820 | A | * | 5/1991 | Matzusawa et al. | ........ 341/156 |
| 5,151,700 | A | * | 9/1992 | Matzusawa et al. | ........ 341/156 |
| 5,187,483 | A | * | 2/1993 | Yonemaru | ................... 341/156 |
| 5,539,406 | A | * | 7/1996 | Kouno et al. | ................ 341/155 |

FOREIGN PATENT DOCUMENTS

| JP | 58009426 A | 1/1983 |
| JP | 2-39136 | 9/1990 |

* cited by examiner

Primary Examiner—Michael J. Tokar
Assistant Examiner—John B Nguyen
(74) Attorney, Agent, or Firm—Parkhurst & Wendel, L.L.P.

(57) ABSTRACT

The present invention provides a serial/parallel A/D converter which is capable of performing a high-speed and high-accuracy operation even in the case where an analog input voltage Vin greatly varies in a period between a previous sampling period in which the analog input voltage is held and the next sampling period, when converting the analog input voltage Vin input into a digital value. This serial/parallel A/D converter includes a lower-order reference voltage initializing circuit 8 for initializing a lower-order reference voltage to an initialization voltage Vrc 23. The initialization voltage Vrc 23 is generated as the lower-order reference voltage in an arbitrary period from the start of sampling of the analog input voltage until the start of a comparison operation for the lower-order reference voltage, the value of the lower-order reference voltage is changed from the value of the initialization voltage to a voltage value which is decided on the basis of higher-order code selection signals P0C–P3C from a higher-order code selecting circuit 14, and the value of the lower-order reference voltage which is decided on the basis of the higher-order code selection signals P0C–P3C is compared with the value of the analog input voltage.

11 Claims, 13 Drawing Sheets

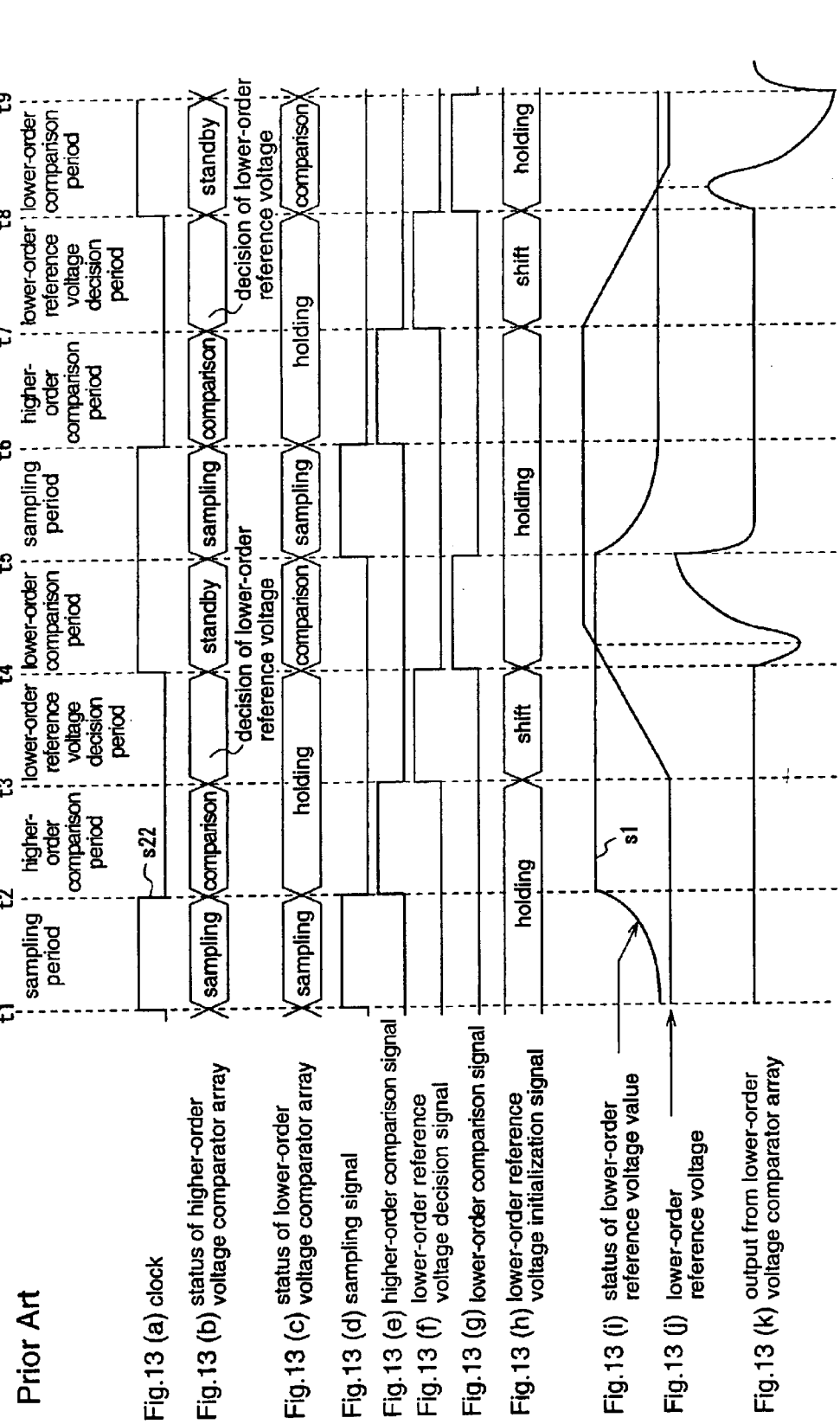

US 6,741,192 B2

A/D CONVERSION METHOD FOR SERIAL/ PARALLEL A/D CONVERTER, AND SERIAL/ PARALLEL A/D CONVERTER

FIELD OF THE INVENTION

The present invention relates to a serial/parallel A/D converter.

BACKGROUND OF THE INVENTION

With advances in digitization of signal processing in the field of communications and videos and enhancement of performances of video and communication devices, A/D converters as key devices for the digital signal processing are also required to achieve speedup and higher accuracy. As a basic configuration of a high-speed, high-accuracy A/D converter, there is a serial/parallel A/D converter (See U.S. Pat. No. 1,612,640).

Hereinafter, a construction and an operation of a conventional serial/parallel A/D converter will be described with reference to FIGS. 12 and 13.

Initially, the construction of the conventional serial/parallel A/D converter will be described with reference to FIG. 12. FIG. 12 is a diagram illustrating the construction of a conventional four-bit serial/parallel A/D converter.

As shown in FIG. 12, the conventional serial/parallel A/D converter comprises a reference resistor and switch array 12 which are connected between reference voltages 2 and 3, a higher-order voltage comparator array 13 for deciding higher-order two bits, a higher-order code selecting circuit 14 which outputs higher-order code selection signals P0C–P3C on the basis of higher-order voltage comparison results C1C–C3C from the higher-order voltage comparator array 13, a higher-order coding circuit 15 which outputs a two-bit higher-order binary code in accordance with the higher-order code selection signals, a lower-order voltage comparator array 16 for deciding lower-order two bits, a lower-order code selecting circuit 17 which outputs lower-order code selection signals P0F–P3F on the basis of lower-order voltage comparison results C0F–C2F from the lower-order voltage comparator array 16, a lower-order coding circuit 18 which outputs a two-bit lower-order binary code in accordance with the lower-order code selection signals, a code compositing circuit 19 which performs a logic operation on the two-bit higher-order binary code and the two-bit lower-order binary code, thereby to output a four-bit digital signal, and a control signal generating circuit 21 which generates various kinds of control signals for controlling the operational timing of the serial/parallel A/D converter.

The reference resistor and switch array 12 includes a reference resistor 4 that comprises resistors R01–R04, R11–R14, R21–R24, and R31–R34, each having the same resistance value, for dividing the potential between the reference voltages 2 and 3 into 16 equal potentials; and a lower-order reference voltage selection switch 5 that comprises switches S01–S03, S11–S13, S21–S23, and S31–S33 for selecting a lower-order reference voltage, which are provided at positions at which the potential is equally divided into sixteen, respectively.

One input terminal of each voltage comparator 6 constituting the higher-order voltage comparator array 13 is connected to points d1, d2 or d3 at which the potential difference between the reference voltages 2 and 3 of the reference resistor and switch array 12 is divided into four equal potentials, and the other input terminal is connected to an analog input terminal 1. Output terminals of the higher-order voltage comparator array 13 are connected to the higher-order code selecting circuit 14, and output terminals of the higher-order code selecting circuit 14 are connected to input terminals of the higher-order coding circuit 15.

Further, one input terminal of each voltage comparator 6 constituting the lower-order voltage comparator array 16 is connected through the lower-order reference voltage selection switch 5 to the point at which the voltage between the respective points d1, d2 and d3 to which the respective voltage comparators 6 of the higher-order voltage comparator array 13 are connected, is divided into four equal potentials by the reference resistor 4 in the reference resistor and switch array 12, and the other input terminal is connected to the analog input terminal 1. Output terminals of the lower-order voltage comparator array 16 are connected to the lower-order code selecting circuit 17, and output terminals of the lower-order code selecting circuit 17 are connected to the lower-order coding circuit 18.

Output terminals of the higher-order coding circuit 15 and the lower-order coding circuit 18 are connected to the code compositing circuit 19, and a four-bit digital output is obtained from an output terminal of the code compositing circuit 19.

The control signal generating circuit 21 generates various kinds of control signals for controlling the operational timing of the serial/parallel A/D converter, i.e., a sampling signal, a higher-order comparison signal, a lower-order reference voltage decision signal, and a lower-order comparison signal, on the basis of a clock s22 that is input from a clock terminal 22. The sampling signal is input to the respective voltage comparators 6 of the higher-order voltage comparator array 13 and the lower-order voltage comparator array 16, the higher-order comparison signal is input to the higher-order voltage comparator array 13, the lower-order reference voltage decision signal is input to the higher-order voltage comparator array 13, and the lower-order comparison signal is input to the lower-order voltage comparator array 16, respectively. In FIG. 12, these control signals are not shown for the sake of simplification.

Next, the operation of the so-constructed serial/parallel A/D converter will be described with reference to FIG. 13. FIG. 13 is a timing chart illustrating the operation of the conventional serial/parallel A/D converter. In this figure, reference character (a) shows a clock, (b) shows a status of the higher-order voltage comparator array, (c) shows a status of the lower-order voltage comparator array, (d) shows a sampling signal, (e) shows a higher-order comparison signal, (f) shows a lower-order reference voltage decision signal, (g) shows a lower-order comparison signal, (h) shows a status of a lower-order reference voltage, (i) shows an analog input voltage, (j) shows the lower-order reference voltage, and (k) shows an output from the lower-order voltage comparator array. In the construction shown in FIG. 12, there are three lower-order reference voltages and the lower-order voltage comparator array have three outputs, while FIG. 13 shows only one lower-order reference voltage and one output of the lower-order voltage comparator array for the sake of simplification.

Initially, in a sampling period (t1–t2 period), the higher-order voltage comparator array 13 and the lower-order voltage comparator array 16 are simultaneously connected to the analog input terminal 1, and at a falling time of the sampling signal from the control signal generating circuit 21, the respective comparators 6 of the higher-order voltage comparator array 13 and the lower-order voltage comparator array 16 hold an equal analog input voltage Vin of an analog input signal s1 which is input from the analog input terminal 1.

Then, in a higher-order comparison period (t2–t3 period), the respective voltage comparators 6 of the higher-order voltage comparator array 13 compare the analog input voltage Vin which is held in the sampling period, with respective higher-order reference voltages Vr1c, Vr2c and Vr3c which are the voltage values at the points d1, d2 and d3 at which the potential difference between the reference voltages 2 and 3 is divided into four equal potentials. Then, at a falling time of the higher-order comparison signal from the control signal generating circuit 21, the respective voltage comparators 6 of the higher-order voltage comparator array 13 output higher-order voltage comparison results C1C, C2C and C3C as the results of the comparison. Thereafter, the higher-order voltage comparison results C1C, C2C and C3C are inputted to the higher-order code selecting circuit 14, then converted into higher-order code selection signals P0C, P1C, P2C and P3C, and the higher-order coding circuit 15 outputs a two-bit higher-order binary code in accordance with the higher-order code selection signals P0C, P1C, P2C and P3C.

Next, in a lower-order reference voltage decision period (t3–t4 period), at a rising time of the lower-order reference voltage decision signal from the control signal generating circuit 21, an on/off state of the lower-order reference voltage selection switch 5 in the reference resistor and switch array 12 is decided on the basis of the higher-order code selection signals P0C, P1C, P2C and P3C which are output from the higher-order code selecting circuit 14 in the higher-order comparison period, thereby deciding values of lower-order reference voltages Vr1f, Vr2f and Vr3f which are input to the lower-order voltage comparator array 16.

In a lower-order comparison period (t4–t5 period), the respective voltage comparators 6 of the lower-order voltage comparator array 16 compare the analog input voltage Vin which is held in the sampling period, and the lower-order reference voltages Vr1f, Vr2f and Vr3f which are selected by the lower-order reference voltage selection switch 5 of the reference resistor and switch array 12. Then, at a falling time of the lower-order comparison signal from the control signal generating circuit 21, the respective voltage comparators 6 of the lower-order voltage comparator array 16 output lower-order voltage comparison results C0F, C1F and C2F as the results of the comparison. Thereafter, the lower-order voltage comparison results C0F, C1F and C2F are input to the lower-order code selecting circuit 17, then the lower-order code selecting circuit 17 converts these comparison results into lower-order code selection signals P0F, P1F, P2F and P3F, and the lower-order coding circuit 18 outputs a two-bit lower-order binary code in accordance with the lower-order code selection signals P0F, P1F, P2F and P3F. Then, the code compositing circuit 19 performs a logic operation on the two-bit higher-order binary code output from the higher-order coding circuit 15 and the two-bit lower-order binary code output from the lower-order coding circuit 18, thereby outputting a four-bit digital output from a digital output terminal 11.

As described above, according to the conventional serial/parallel A/D converter, initially the respective voltage comparators 6 of the higher-order voltage comparator array 13 and the lower-order voltage comparator array 16 hold the input voltage Vin of the analog input signal s1 which is input from the analog input terminal 1, thereafter the respective voltage comparators 6 of the higher-order voltage comparator array 13 compare the analog input voltage Vin with the higher-order reference voltages Vr1c, Vr2c and Vr3c, then the lower-order reference voltages Vr1f, Vr2f and Vr3f are determined by deciding an on/off state of the lower-order reference voltage switch 5 constituting the reference resistor and switch array 12, on the basis of the higher-order voltage comparison results C1C, C2C and C3C as comparison results, and the respective voltage comparators 6 of the lower-order voltage comparator array 16 compare the determined lower-order reference voltages Vr1f, Vr2f and Vr3f with the analog input voltage Vin which is held in the respective voltage comparators 6 of the lower-order voltage comparator array.

Therefore, according to the conventional serial/parallel A/D converter, as shown in FIG. 13(h), the values of the lower-order reference voltages Vr1f, Vr2f and Vr3f remain held from the period in which the lower-order comparison operation is performed in the lower-order voltage comparator array 16 (t4–t5 period), through a period in which sampling of a next analog input voltage is performed in the higher-order voltage comparator array 13 and the lower-order voltage comparator array 16 (t5–t6 period), to a period in which the higher-order comparison operation is performed in the higher-order voltage comparator array 13 (t6–t7 period). As a result, the on/off state of the lower-order reference voltage selection switch 5 of the reference resistor and switch array 12 for selecting the values of the lower-order reference voltages Vr1f, Vr2f and Vr3f is fixed over the above-mentioned period (t4–t7 period).

When the analog signal s1 which greatly varies between a previous sampling period and the subsequent sampling period as shown in FIG. 13(i) is input to the above-described conventional serial/parallel A/D converter, variation in the values of the lower-order reference voltages Vr1f, Vr2f and Vr3f is also increased as shown in FIG. 13(j), resulting in a longer transition time from when the lower-order reference voltages change to when the lower-order reference voltages are stabilized at new values. However, since the on/off state of the lower-order reference voltage selection switch 5 of the reference resistor and switch array 12 is fixed until the lower-order reference voltage decision period, when the conventional serial/parallel A/D converter is operated at a high speed, the operation shifts from the lower-order reference voltage decision period (e.g., t7–t8 period in FIG. 13) to the lower-order comparison period (t8–t9 period) before the lower-order reference voltages Vr1f, Vr2f and Vr3f change in voltage values and are stabilized at new values, whereby the respective voltage comparators 6 of the lower-order voltage comparator array 16 unfavorably start the comparison operation of the analog input voltage Vin with pre-stabilization lower-order reference voltages (see FIG. 13(j)).

As a result, as shown in FIG. 13(k), the respective voltage comparators 6 of the lower-order voltage comparator array 16 initially judge that the analog input voltage Vin is larger than the lower-order reference voltage, and then judge that the lower-order reference voltage is larger than the analog input voltage Vin, resulting in a deteriorated accuracy of output from the lower-order voltage comparator array 16, which prevents speedup and improvement in accuracy of the serial/parallel A/D converter.

SUMMARY OF THE INVENTION

The present invention has for its object to provide a serial/parallel A/D converter which is capable of performing a high-speed and high-accuracy operation even when an analog input voltage Vin greatly varies between a sampling period in which the analog input voltage Vin is held and the subsequent sampling period, and an A/D conversion method for the serial/parallel A/D converter.

Other objects and advantages of the invention will become apparent from the detailed description that follows. The detailed description and specific embodiments described are provided only for illustration since various additions and modifications within the scope of the invention will be apparent to those of skill in the art from the detailed description.

According to a 1st aspect of the present invention, there is provided an A/D conversion method for a serial/parallel A/D converter which compares an analog input voltage which randomly varies with time and a prescribed first reference voltage, to generate a first binary code, as well as compares a second reference voltage which is decided on the basis of the result of the comparison and the analog input voltage, to generate a second binary code, and performs a logic operation on the generated first and second binary codes, thereby generating a digital value, said method comprising: a sampling and initialization step of sampling the analog input voltage received, as well as initializing a previous second reference voltage to a prescribed initialization voltage; a first voltage comparison step of comparing the value of the analog input voltage which has been sampled in the sampling and initialization step and the first reference voltage, to generate the first binary code; and a second voltage comparison step of comparing the value of the second reference voltage which has been changed from the prescribed initialization voltage to a voltage which is decided on the basis of the result of the comparison in the first voltage comparison step, with the analog input voltage which has been sampled in the sampling and initialization step, to generate the second binary code. Therefore, a previous second reference voltage can be initialized to a prescribed initialization value while the analog input voltage is sampled, and in the second voltage comparison step, the value of the second reference voltage can be changed from the prescribed initialization voltage to a value which is decided on the basis of the result of the comparison between the first reference voltage and the sampled analog input voltage. As a result, even when the analog input voltage greatly varies in a period between sampling of the analog input voltage and sampling of a next analog input voltage, the amount of changes of the second reference voltage in the second voltage comparison step can be reduced, whereby the AD conversion can be performed at a high speed and high accuracy.

According to a 2nd aspect of the present invention, there is provided an A/D conversion method for a serial/parallel A/D converter which compares an analog input voltage which randomly varies with time and a prescribed first reference voltage, to generates a first binary code, as well as compares a second reference voltage which is decided on the basis of the result of the comparison, and the analog input voltage, to generates a second binary code, and performs a logic operation on the generated first and second binary codes, thereby generating a digital value, said method comprising: a sampling step of sampling the analog input voltage received; a first voltage comparison and initialization step of comparing the analog input voltage which has been sampled in the sampling step and the first reference voltage, and initializing a previous second reference voltage to a prescribed initialization voltage, to generate the first binary code; and a second voltage comparison step of comparing the second reference voltage which has been changed from the prescribed initialization voltage to a voltage value which is decided on the basis of the result of the comparison in the first voltage comparison and initialization step, and the analog input voltage which has been sampled in the sampling step, to generate the second binary code. Therefore, a previous second reference voltage can be initialized to a prescribed initialization value while the first reference voltage is compared with the sampled value of the analog input voltage, and in the second voltage comparison step, the value of the second reference voltage can be changed from the prescribed initialization voltage to a value which is decided on the basis of the result of the comparison between the first reference voltage and the sampled analog input voltage value. As a result, even when the analog input voltage greatly varies in a period between sampling of the analog input voltage and sampling of a next analog input voltage, the amount of changes of the second reference voltage in the second voltage comparison step can be reduced, whereby the AD conversion can be performed at a high speed and high accuracy. Further, since the previous second reference voltage is initialized to the prescribed initialization voltage while the value of the first reference voltage is compared with the sampled value of the analog input voltage, the value of the second reference voltage is held at the sampling of the analog input voltage and would not be changed, whereby a stable sampling operation can be performed without being affected by noises that are caused by the change of the second reference voltage.

According to a 3rd aspect of the present invention, there is provided an A/D conversion method for a serial/parallel A/D converter which compares an analog input voltage which randomly varies with time and a prescribed first reference voltage, to generate a first binary code, as well as repeatedly compares a reference voltage which is decided on the basis of the result of the comparison and the analog input voltage to generate a binary code, thereby generating second to n-th ("n" is an integer satisfying $n \geq 3$) binary codes, and performs a logic operation on the generated first to n-th binary codes, thereby generating a digital value, said method comprising steps of: sampling the analog input voltage received, as well as initializing previous second to n-th reference voltages to a prescribed initialization voltage; and carrying out an m-th voltage comparison step ("m" is an integer satisfying $1 \leq m < n$) of comparing the value of the analog input voltage which has been sampled in the sampling and initialization step and the m-th reference voltage, to generate the m-th binary code, and an (m+1)-th voltage comparison step of comparing the value of the (m+1)-th reference voltage which has been changed from the prescribed initialization voltage to a voltage value which is decided on the basis of the result of the comparison in the m-th voltage comparison step and the value of the analog input voltage which has been sampled in the sampling and initialization step, to generate the (m+1)-th binary code, from m=1 to m=n−1. Therefore, a previous (m+1)-th reference voltage can be initialized to a prescribed initialization value while the analog input voltage is sampled, and in the (m+1)-th voltage comparison step, the value of the (m+1)-th reference voltage can be changed from the prescribed initialization voltage to a value which is decided on the basis of the result of the comparison between the m-th reference voltage and the sampled analog input voltage. As a result, even when the analog input voltage greatly varies in a period between the sampling of the analog input voltage and sampling of a next analog input voltage, the amount of changes of the (m+1)-th reference voltage in the (m+1)-th voltage comparison step can be reduced, whereby AD conversion can be performed at a high speed and high accuracy.

According to a 4th aspect of the present invention, there is provided an A/D conversion method for a serial/parallel A/D converter which compares an analog input voltage which randomly varies with time and a prescribed first reference voltage, to generate a first binary code, as well as repeatedly compares a reference voltage which is decided on the basis of the result of the comparison and the analog input voltage to generate a binary code, thereby generating second to n-th ("n" is an integer satisfying n≧3) binary codes, and performs a logic operation on the generated first to n-th binary codes, thereby generating a digital value, said method comprising steps of: sampling the analog input voltage received; and carrying out an m-th voltage comparison and initialization step ("m" is an integer satisfying 1≦m<n) of comparing the value of the analog input voltage which has been sampled in the sampling step and the m-th reference voltage, as well as initializing a previous (m+1)-th reference voltage to a prescribed initialization voltage, to generate the m-th binary code, and an (m+1)-th voltage comparison step of comparing the value of the (m+1)-th reference voltage which has been changed from the prescribed initialization voltage to a voltage value which is decided on the basis of the result of the comparison in the m-th voltage comparison and initialization step and the value of the analog input voltage which has been sampled in the sampling step, to generate the (m+1)-th binary code, from m=1 to m=n−1. Therefore, a previous (m+1)-th reference voltage can be initialized to a prescribed initialization value while the m-th reference voltage is compared with the sampled analog input voltage, and in the (m+1)-th voltage comparison step, the value of the m-th reference voltage can be changed from the prescribed initialization voltage to a value which is decided on the basis of the result of the comparison between the m-th reference voltage and the sampled analog input voltage. As a result, even when the analog input voltage greatly varies in a period between the sampling of the analog input voltage and sampling of a next analog input voltage, the amount of changes of the (m+1)-th reference voltage in the (m+1)-th voltage comparison step can be reduced, whereby the AD conversion can be performed at a high speed and high accuracy. Further, since the previous (m+1)-th reference voltage is initialized to the prescribed initialization voltage while the m-th reference voltage is compared with the sampled analog input voltage, the value of the (m+1)-th reference voltage is held at the sampling of the analog input voltage and would not be varied, whereby a stable sampling operation can be performed without being affected by noises that are caused by the change of the (m+1)-th reference voltage.

According to a 5th aspect of the present invention, there is provided a serial/parallel A/D converter for converting an analog input voltage into a digital value, comprising: a reference resistor and switch array which is constituted by a resistor array comprising plural resistors which are serially connected, and plural switches connected to plural connection points of the resistor array, for selectively outputting a reference voltage which is compared with the analog input voltage that randomly varies with time; a first voltage comparator array for sampling the analog input voltage received, and comparing the sampled analog input voltage and a first reference voltage which is output from the reference resistor and switch array, to output a first comparison result; a first code selecting circuit which receives the first comparison result output from the first voltage comparator array, and outputs a first code selection signal; a first coding circuit which outputs a first binary code that is selected in accordance with the first code selection signal output from the first code selecting circuit; a second voltage comparator array for sampling the analog input voltage received, and comparing the sampled analog input voltage and a second reference voltage which is selectively output by the plural switches constituting the reference resistor and switch array in accordance with the first code selection signal, to output a second comparison result; a second code selecting circuit which receives the second comparison result output from the second voltage comparator array, and outputs a second code selection signal; a second coding circuit which outputs a second binary code which is selected in accordance with the second code selection signal output from the second code selecting circuit; and a code compositing circuit which performs a logic operation on the first binary code and the second binary code, to obtain a digital value, in which the second voltage comparator array samples the received analog input voltage, receives and holds a prescribed initialization voltage in an arbitrary period of time, and compares the value of the second reference voltage which has been changed from the prescribed initialization voltage to a voltage value which is selectively output by the plural switches constituting the reference resistor and switch array in accordance with the first code selection signal, and the value of the sampled analog input voltage. Therefore, the second reference voltage can be initialized to a prescribed voltage value in an arbitrary period from the start of the sampling of the analog input voltage to the comparison for the second reference voltage. As a result, even when the analog input voltage greatly varies in a period between the sampling of the analog input voltage and sampling of a next analog input voltage, the amount of variations of the second reference voltage can be reduced, thereby realizing a serial/parallel A/D converter which is operable at high speed with high accuracy.

According to a 6th aspect of the present invention, in the serial/parallel A/D converter of the 5th aspect, the initialization voltage is a reference voltage which is output from one of the plural connection points of the resistor array constituting the reference resistor and switch array. Therefore, the serial/parallel A/D converter is not required to have a prescribed voltage to which the second reference voltage is initialized, thereby simplifying the construction of the serial/parallel A/D converter.

According to a 7th aspect of the present invention, the serial/parallel A/D converter of the 5th aspect further includes a reference voltage initializing circuit which receives the second reference voltage output from the reference resistor and switch array, the initialization voltage, and an initialization control signal indicating the arbitrary period, and outputs either the second reference voltage or the prescribed voltage to the second voltage comparator array in accordance with the initialization control signal, and the reference voltage initializing circuit outputs the initialization voltage in the arbitrary period, while outputting the second reference voltage which is output from the reference resistor and switch array in periods other than the arbitrary period. Therefore, the second reference voltage can be initialized to a prescribed voltage value in an arbitrary period, and the prescribed voltage value can be changed to a voltage value which is selectively output on the basis of the first comparison result. As a result, even when the analog input voltage greatly varies in a period between the sampling of the analog input voltage and sampling of a next analog input voltage, the amount of variations of the second reference voltage can be reduced, thereby realizing a serial/parallel A/D converter which is operable at a high speed with high accuracy.

According to an 8th aspect of the present invention, in the serial/parallel A/D converter of the 5th aspect, the first code selecting circuit receives an initialization control signal indicating the arbitrary period, as well as the first comparison result output from the first voltage comparator array, and in the arbitrary period, the first code selection signal is output to the first coding circuit, as well as an initialization voltage selection signal for selecting the prescribed initialization voltage by fixing predetermined switches among the plural switches constituting the reference resistor and switch array in on-state while fixing all other switches in off-state is output to the reference resistor and switch array, and in periods other than the arbitrary period, the first code selection signal is output to the first coding circuit and the reference resistor and switch array. Therefore, the second reference voltage can be initialized to a prescribed voltage value in an arbitrary period without the need for adding any new components to the serial/parallel A/D converter, whereby the construction of the serial/parallel A/D converter which is operable at a high speed with high accuracy can be more simplified.

According to a 9th aspect of the present invention, in the serial/parallel A/D converter of the 5th aspect, the arbitrary period is a period during which the analog input voltage input is sampled in the first and second voltage comparator arrays. Therefore, the second reference voltage can be initialized to a prescribed voltage value in the period when the analog input voltage is held, thereby realizing the serial/parallel A/D converter which is operable at a high speed with high accuracy.

According to a 10th aspect of the present invention, in the serial/parallel A/D converter of the 5th aspect, arbitrary period is a period during which the first voltage comparator array compares the analog voltage value and the first reference voltage which is output from the reference resistor and switch array, and outputs the first comparison result. Therefore, the value of the second reference voltage is held at the sampling of the analog input voltage and would not be varied, whereby a stable sampling operation can be performed without being affected by noises that are caused by the change of the second reference voltage.

According to an 11th aspect of the present invention, there is provided a serial/parallel A/D converter for converting an analog input voltage into a digital value, comprising: a reference resistor and switch array which is constituted by a resistor array comprising plural resistors which are serially connected, and plural switches connected to plural connection points of the resistor array, for selectively outputting a reference voltage which is compared with the analog input voltage that randomly varies with time; a first voltage comparator array for sampling the analog input voltage received, and comparing the sampled analog input voltage and a first reference voltage which is output from the reference resistor and switch array, to output a first comparison result; second to n-th voltage comparator arrays for sampling the analog input voltage received, and comparing the sampled analog input voltage and second to n-th reference voltages which are generated in the reference resistor and switch array on the basis of comparison results from the first to (n−1)-th ("n" is an integer satisfying n≧3) voltage comparator arrays, respectively, to output second to n-th comparison results, respectively; first to n-th code selecting circuits which receive the first to n-th comparison results output from the first to n-th voltage comparator arrays, respectively, and output first to n-th code selection signals, respectively; first to n-th coding circuits which output first to n-th binary codes that are selected in accordance with the first to n-th code selection signals output from the first to n-th code selecting circuits, respectively; and a code compositing circuit which performs a logic operation on the first to n-th binary codes output from the first to n-th coding circuits, to obtain a digital value, in which each of said second to n-th voltage comparator arrays samples the analog input voltage, receives and holds a prescribed initialization voltage in an arbitrary period of time, and compares each value of the second to n-th reference voltages which has been changed from the prescribed initialization voltage to a voltage value that is selectively output by the plural switches constituting the reference resistor and switch array adaptively to the respective first to (n−1)-th code selection signals, with the value of the sampled analog input voltage. Therefore, the second to n-th reference voltages can be initialized to a prescribed voltage value in an arbitrary period from the start of the sampling of the analog input voltage to the comparison for the second to n-th reference voltages. As a result, even when the analog input voltage greatly varies in a period between the holding of the analog input voltage and holding of a next analog input voltage, the amount of variations of the second to n-th reference voltages can be reduced, thereby realizing a serial/parallel A/D converter which is operable at high speed with high accuracy.

BRIEF DESCRIPTION OF THE DRAWINGS

FIGS. 13(a)–13(k) are a timing chart for the conventional serial/parallel A/D converter.

DETAILED DESCRIPTION OF THE PREFERRED EMBODIMENTS

Hereinafter, specific embodiments of a serial/parallel A/D converter according to the present invention will be described.

[Embodiment 1]

Hereinafter, a serial/parallel A/D converter according to a first embodiment will be described with reference to FIGS. 1–4.

The serial/parallel A/D converter according to this first embodiment is provided with a lower-order reference voltage initializing circuit for initializing lower-order reference voltages Vr1f, Vr2f and Vr3f which are selected by the reference resistor and switch array 12, to prescribed voltage values, thereby to initialize the lower-order reference voltages Vr1f, Vr2f and Vr3f at prescribed voltage values in an arbitrary period after the end of a lower-order comparison period before the start of the next lower-order comparison period.

Figure 1:
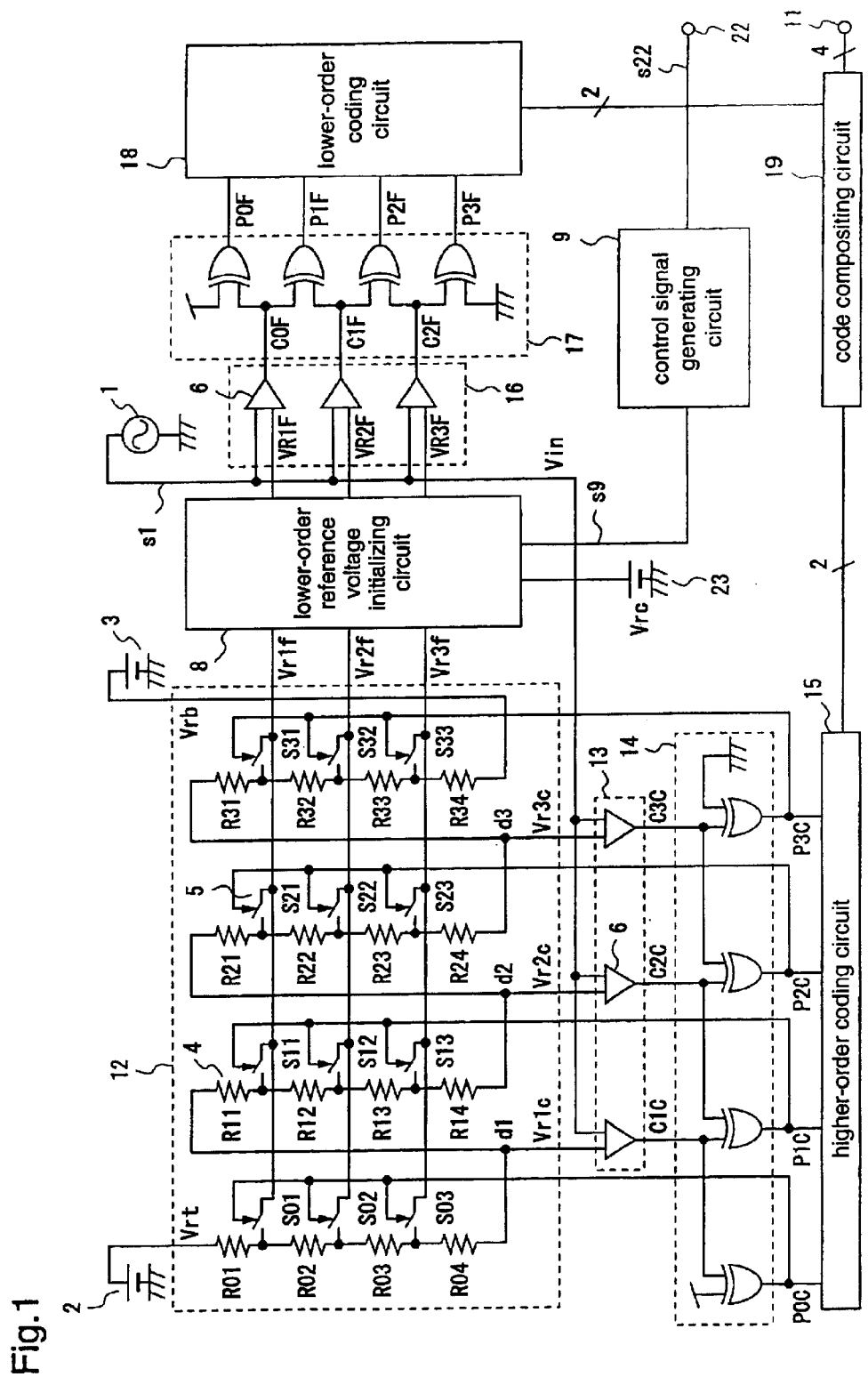
FIG. 1 is a diagram illustrating a construction of a four-bit serial/parallel A/D converter according to a first embodiment of the present invention.
Figure 12:
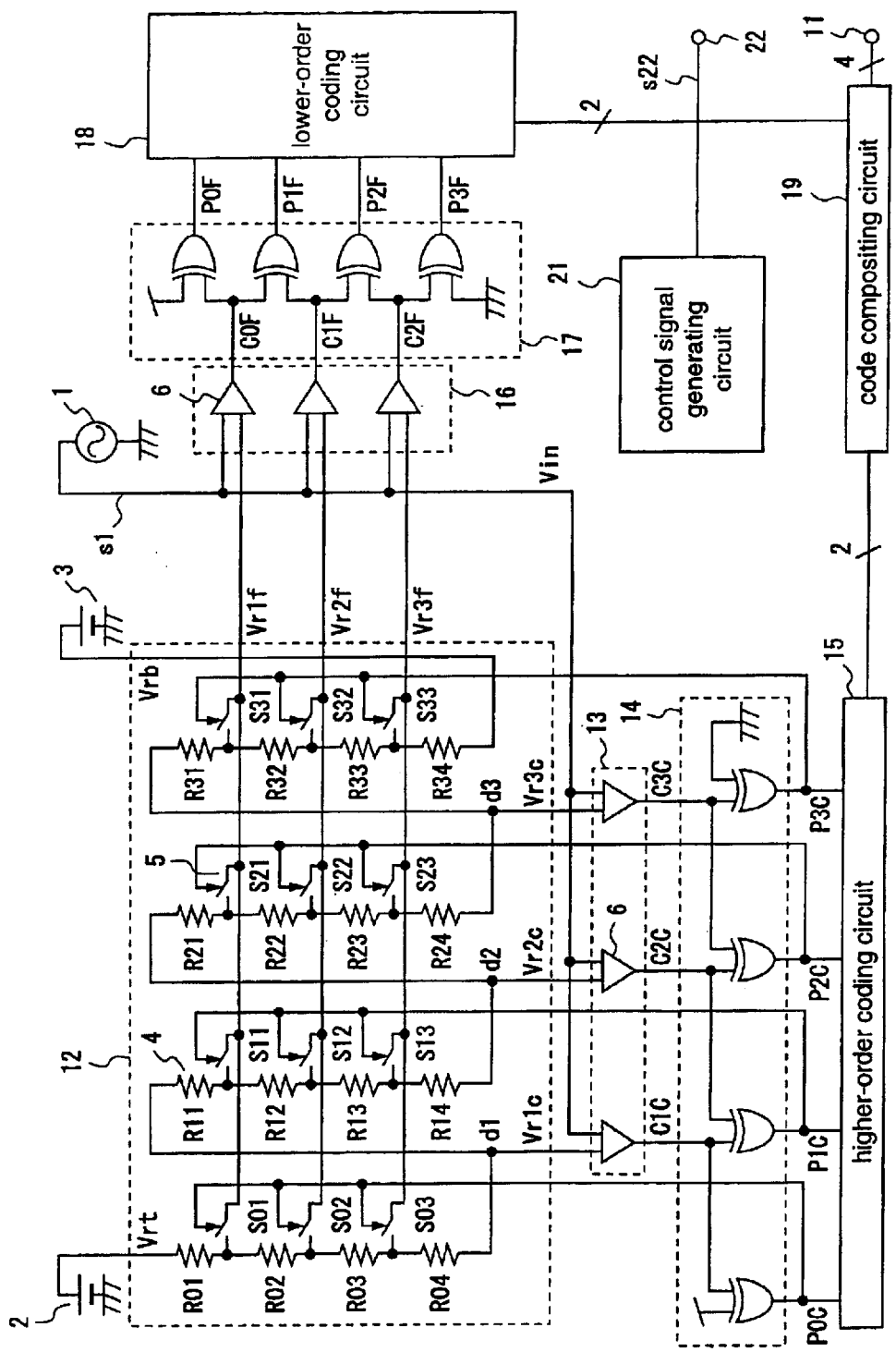
FIG. 12 is a diagram illustrating a construction of a conventional four-bit serial/parallel A/D converter.

Initially, the construction of the serial/parallel A/D converter according to the first embodiment will be described with reference to FIG. 1. In this first embodiment, a description will be given taking a case as an example, where the serial/parallel A/D converter performs a logic operation on a two-bit first binary code (hereinafter, referred to as a "higher-order code") and a two-bit second binary code (hereinafter, referred to as a "lower-order code") to obtain a four-bit digital output, like the conventional serial/parallel A/D converter shown in FIG. 12. FIG. 1 is a diagram illustrating the construction of the four-bit serial/parallel A/D converter according to the first embodiment.

With reference to FIG. 1, the serial/parallel A/D converter comprises a reference resistor and switch array 12 which are connected between reference voltages 2 and 3, a higher-order voltage comparator array (first voltage comparator array) 13 for deciding higher-order two bits, a higher-order code selecting circuit (first code selecting circuit) 14 which outputs higher-order code selection signals P0C–P3C on the basis of higher-order voltage comparison results C1C–C3C from the higher-order voltage comparator array 13, a higher-order coding circuit (first coding circuit) 15 which outputs a two-bit higher-order binary code in accordance with the higher-order code selection signals, a lower-order voltage comparator array (second voltage comparator array) 16 for deciding lower-order two bits, a lower-order code selecting circuit (second code selecting circuit) 17 which outputs lower-order code selection signals P0F–P3F on the basis of lower-order voltage comparison results C0F–C2F from the lower-order voltage comparator array 16, a lower-order coding circuit (second coding circuit) 18 which outputs a two-bit lower-order binary code in accordance with the lower-order code selection signals, a code compositing circuit 19 which performs a logic operation on the two-bit higher-order binary code and the two-bit lower-order binary code to obtain a four-bit digital output, a control signal generating circuit 9 which generates various kinds of control signals on the basis of a clock s22 which is input from a clock terminal 22, a lower-order reference voltage initializing circuit (reference voltage initializing circuit) 8 which outputs prescribed voltage values as lower-order reference voltages Vr1f, Vr2f and Vr3f which are input to the lower-order voltage comparator array 16, during a certain period of time, thereby initializing the lower-order reference voltages, and an initialization voltage Vrc 23 which is input to the lower-order reference voltage initializing circuit 8.

Input terminals of the lower-order reference voltage initializing circuit 8 are connected to a lower-order reference voltage initialization signal s9 indicating a period during which the prescribed voltage values are output as the lower-order reference voltages, which is output from the control signal generating circuit 9, and the initialization voltage Vrc 23, and further connected to respective points at which the potential difference between the reference voltages 2, 3 of the reference resistor and switch array 12 and points d1, d2, d3 to which the voltage comparators 6 of the higher-order voltage comparator array 13 are connected is divided into 16 equal potentials by the reference resistors 4, via the lower-order reference voltage selection switch 5. Output terminals of the lower-order reference voltage initializing circuit 8 are connected to one input terminal of respective voltage comparators 6 constituting the lower-order voltage comparator array 16, respectively.

Figure 2:
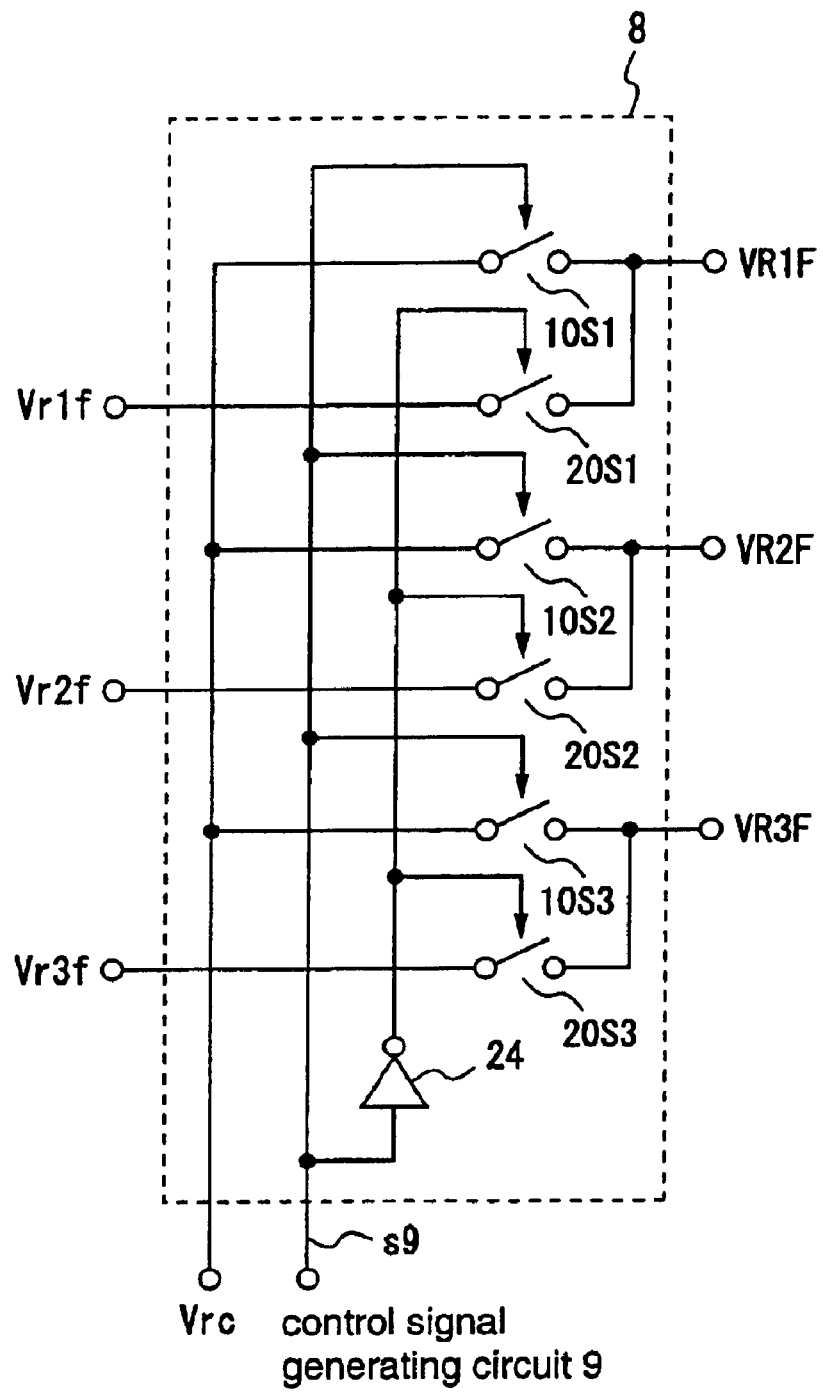
FIG. 2 is a diagram illustrating a construction of a lower-order reference voltage initializing circuit of the serial/parallel A/D converter according to the first embodiment of the invention.

Hereinafter, the construction of the lower-order reference voltage initializing circuit 8 will be described in detail with reference to FIG. 2. For example, as shown in FIG. 2, the lower-order reference voltage initializing circuit 8 comprises lower-order reference voltage initialization switches 10S1, 10S2 and 10S3, lower-order reference voltage input switches 20S1, 20S2 and 20S3, and an inverting circuit 24. One terminal of each of the lower-order reference voltage initialization switches 10S1, 10S2 and 10S3 is connected in common to the initialization voltage Vrc23, and the other terminal is connected to the one input terminal of each voltage comparator 6 of the lower-order voltage comparator array 16. One terminal of each of the lower-order reference voltage input switches 20S1, 20S2 and 20S3 is connected to the lower-order reference voltages Vr1f, Vr2f or Vr3f from the reference resistor and switch array 12, and the other terminal is connected to the one input terminal of each voltage comparator 6 of the lower-order voltage comparator array 16.

When the logical level of the lower-order reference voltage initialization signal s9 is high, the lower-order reference voltage initialization switches 10S1, 10S2 and 10S3 are in on-state while the lower-order reference voltage input switches 20S1, 20S2 and 20S3 are in off-state, and thus the value of the initialization voltage Vrc 23 is output to the respective voltage comparators 6 of the lower-order voltage comparator array 16 as output voltages VR1F, VR2F and VR3F of the lower-order reference voltage initializing circuit 8. On the other hand, when the logical level of the lower-order reference voltage initialization signal s9 is low, the lower-order reference voltage initialization switches 10S1, 10S2 and 10S3 are in off-state while the lower-order reference voltage input switches 20S1, 20S2 and 20S3 are in on-state, and then the respective lower-order reference voltages Vr1f, Vr2f and Vr3f from the reference resistor and switch array 12 are output to the respective voltage comparators 6 of the lower-order voltage comparator array 16 as the output voltages VR1F, VR2F and VR3F of the lower-order reference voltage initializing circuit 8.

Here, a prescribed voltage value to which the lower-order reference voltages Vr1f, Vr2f and Vr3f are initialized by the lower-order reference voltage initializing circuit 8, that is, the value of the initialization voltage Vrc 23 may be any voltage value between the reference voltages 2 and 3, while it is more preferably an intermediate voltage value between the reference voltages 2 and 3. The reason is as follows. When the initialization voltage Vrc 23 is an intermediate voltage value between the reference voltages 2 and 3, even in the case where an analog input voltage Vin greatly varies after the end of a sampling period before the start of the next sampling period (see FIG. 4(j)) and the values of the lower-order reference voltages Vr1f, Vr2f and Vr3f are greatly varied correspondingly (see FIG. 4(k)), a shorter time is needed to change the values of the lower-order reference voltages VR1F, VR2F and VR3F which are input to the lower-order voltage comparator array 16 from the voltage values output from the reference resistor and switch array 12, to the initialization voltage Vrc, or from the initialization voltage Vrc to the voltage values output from the reference resistor and switch array 12.

The control signal generating circuit 9 generates the lower-order reference voltage initialization signal s9 indicating a period during which initialization is performed by outputting a prescribed voltage as the lower-order reference voltages VR1F, VR2F and VR3F that are input to the lower-order voltage comparator array 16 (initialization period), as well as generating the various kinds of control signals for controlling the operational timing of the serial/parallel A/D converter, i.e., the sampling signal, the higher-order comparison signal, the lower-order reference voltage decision signal, and the lower-order comparison signal, on the basis of the clock s22 which is input from the clock terminal 22, like the conventional serial/parallel A/D converter as described above.

The initialization period indicated by the lower-order reference voltage initialization signal s9 may be an arbitrary period from the start of sampling of the analog input voltage Vin in the respective comparators 6 of the higher-order voltage comparator array 13 and the lower-order voltage comparator array 16 to the start of the lower-order voltage comparison operation in the lower-order voltage comparator array 16 in the serial/parallel A/D converter. In the first embodiment, the initialization period is a sampling period during which the analog input voltage Vin is input to the respective voltage comparators 6 of the higher-order voltage comparator array 13 and the lower-order voltage comparator array 16, and subjected to sampling.

Figure 3:
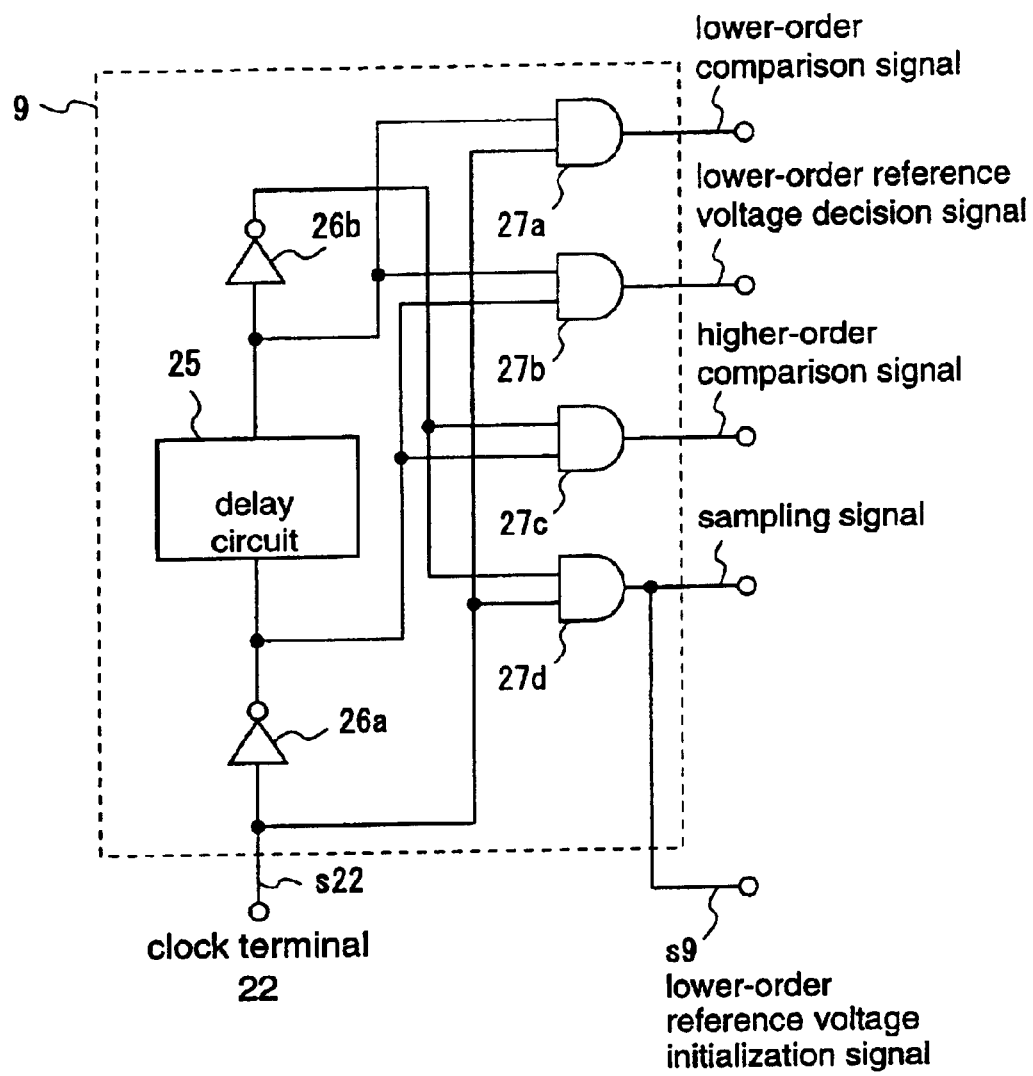
FIG. 3 is a diagram illustrating a construction of a control signal generating circuit of the serial/parallel A/D converter according to the first embodiment of the invention.

A detailed description will be given of the construction of the control signal generating circuit 9 in the case where the initialization period is the sampling period. For example, as shown in FIG. 3, the control signal generating circuit 9 comprises first and second inverting circuits 26a and 26b, a delay circuit 25, and AND circuits 27a–27d. When the clock s22 is input from the clock terminal 22 to the first inverting circuit 26a, the first inverting circuit 26a outputs an inverted signal of the clock s22, then the delay circuit 25 receives the inverted signal of the clock s22 and delays the inverted signal of the clock s22, and the second inverting circuit 26b outputs an inverted signal of the signal output from the delay circuit 25. The AND circuits 27a–27d receive the clock s22 from the clock terminal 22, the output signal from the fist inverting circuit 26a, the output signal from the delay circuit 25, and the output signal from the second inverting circuit 26b, and composite these signals, thereby outputting the sampling signal, the lower-order reference voltage initialization signal s9, the higher-order comparison signal, the lower-order reference voltage decision signal, and the lower-order comparison signal. In the first embodiment, since the initialization period and the sampling period are the same period, the sampling signal and the lower-order reference voltage initialization signal s9 are the same signal.

Other constitutions are the same as those of the conventional serial/parallel A/D converter, and their descriptions will not be given.

Figure 4:
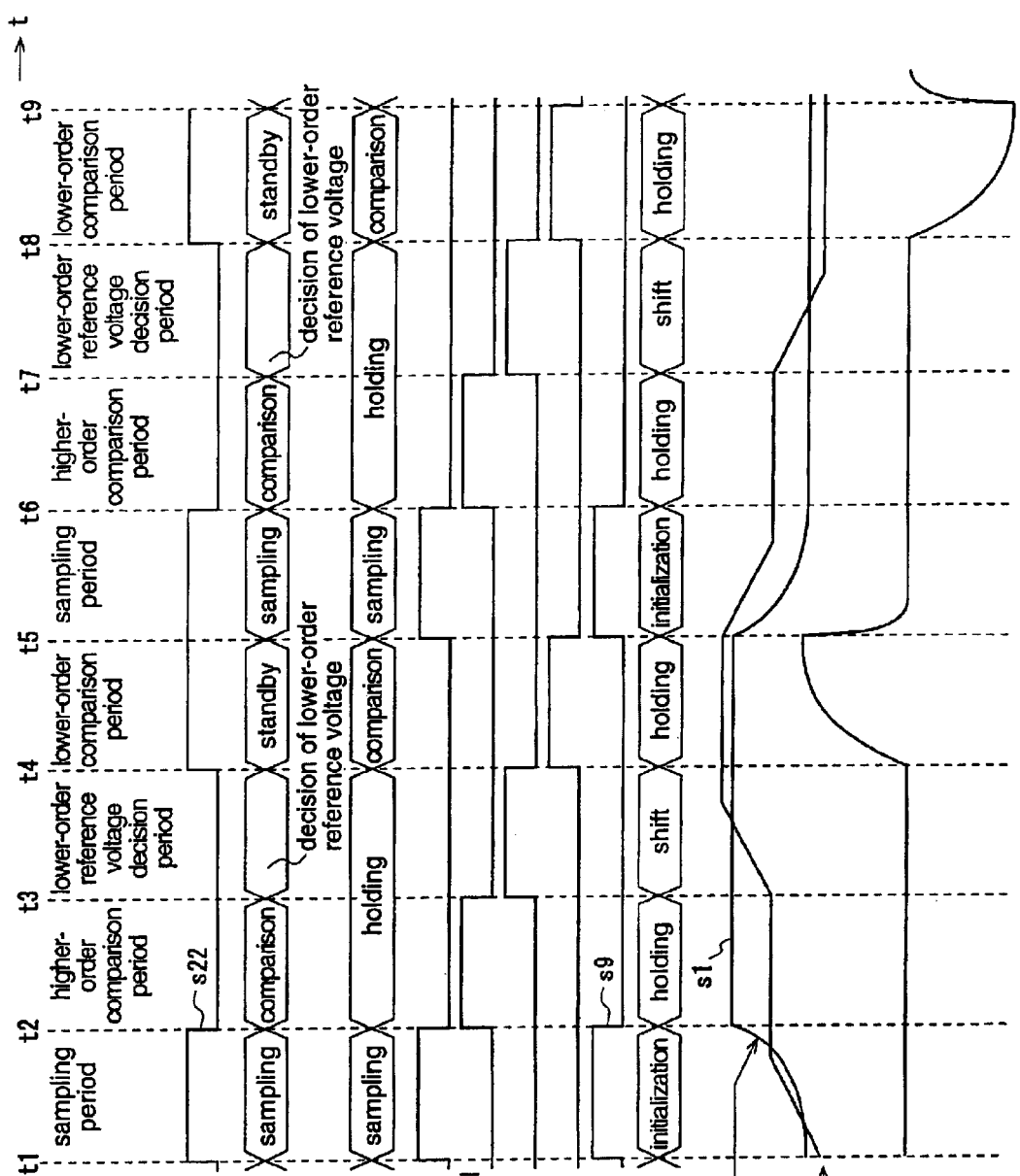
FIGS. 4(a)–4(l) are a timing chart for the serial/parallel A/D converter according to the first embodiment of the invention.

Next, the operation of the four-bit serial/parallel A/D converter according to the first embodiment will be described with reference to FIG. 4. FIG. 4 is a timing chart illustrating the operation of the serial/parallel A/D converter of the first embodiment. In this figure, reference character (a) shows a clock input, (b) shows a status of the higher-order voltage comparator array, (c) shows a status of the lower-order voltage comparator array, (d) shows a sampling signal, (e) shows a higher-order comparison signal, (f) shows a lower-order reference voltage decision signal, (g) shows a lower-order comparison signal, (h) shows a lower-order reference voltage initialization signal, (i) denotes a status of a lower-order reference voltage, (j) shows an analog input voltage, (k) shows an output from the lower-order reference voltage initializing circuit, and (l) shows an output from the lower-order voltage comparator array. In the construction shown in FIG. 1, each of the lower-order reference voltage initializing circuit and the lower-order voltage comparator array has three outputs, while FIG. 4 shows only one output of each of the lower-order reference voltage initializing circuit and the lower-order voltage comparator array for the sake of simplification.

Initially, in a sampling period (t1–t2 period), the higher-order voltage comparator array 13 and the lower-order voltage comparator array 16 are simultaneously connected to the analog input terminal 1, and at a falling time of the sampling signal (see FIG. 4(d)) from the control signal generating circuit 9, the respective voltage comparators 6 of the higher-order voltage comparator array 13 and the lower-order voltage comparator array 16 hold an equal analog input voltage Vin of an analog input signal s1 which is input from the analog input terminal 1.

Since the sampling period is also the period for initializing the lower-order reference voltage (see FIG. 4(i)), at a falling time of the lower-order reference voltage initialization signal s9 (see FIG. 4(h)) from the control signal generating circuit 9, the lower-order reference voltage initializing circuit 8 initializes the respective lower-order reference voltages Vr1f, Vr2f and Vr3f from the reference resistor and switch array 12, to the value of the initialization voltage Vrc 23, and outputs the initialized voltages VR1F, VR2F and VR3F (see FIG. 4(k)). More specifically, at a rising time of the lower-order reference voltage initialization signal s9 from the control signal generating circuit 9, the lower-order reference voltage initialization switches 10S1–10S3 of the lower-order reference voltage initializing circuit 8 are in on-state, while the lower-order reference voltage input switches 20S1–20S3 are in off-state, whereby the lower-order reference voltage initializing circuit 8 outputs the voltage value of the initialization voltage Vrc 23, instead of the respective values of the lower-order reference voltages Vr1f, Vr2f and Vr3f from the reference resistor and switch array 12, as VR1f, VR2f and VR3f.

Then, in a higher-order comparison period (t2–t3 period), the respective voltage comparators 6 of the higher-order voltage comparator array 13 compare the analog input voltage Vin value which is held in the sampling period, with higher-order reference voltage values Vr1c, Vr2c and Vr3c. At a falling time of the higher-order comparison signal (see FIG. 4(e)) from the control signal generating circuit 9, the respective voltage comparators 6 output higher-order voltage comparison results C1C, C2C and C3C as comparison results. Thereafter, on the receipt of the higher-order voltage comparison results C1C, C2C and C3C, the higher-order code selecting circuit 14 converts these comparison results into higher-order code selection signals P0C, P1C, P2C and P3C, and the higher-order coding circuit 15 outputs a two-bit higher-order binary code in accordance with the higher-order code selection signals P0C, P1C, P2C and P3C.

During this higher-order comparison period, the value of the initialization voltage Vrc 23 which is held in each of the voltage comparators 6 of the lower-order voltage comparator array 16 in the initialization period is held (see FIG. 4(i)(k)).

Next, in a lower-order reference voltage decision period (t3–t4 period), at a rising time of the lower-order reference voltage decision signal (see FIG. 4(f)) from the control signal generating circuit 9, the on/off state of the lower-order reference voltage selection switch 5 (switches S01–03, S11–13, S21–23 and S31–33) in the reference resistor and switch array 12 is selected on the basis of the higher-order code selection signals P0C–P3C which are output from the higher-order code selecting circuit 14, thereby switching the values of the lower-order reference voltages Vr1f, Vr2f and Vr3f. To be specific, for example when the analog input voltage value Vin is a value between the higher-order reference voltages Vr1c and Vr2c (Vr1c>Vin>Vr2c), the higher-order voltage comparison results C1C, C2C and C3C output from the higher-order voltage comparator array 13 are "100", and the higher-order code selection signals P0C, P1C, P2C and P3C output from the higher-order code selecting circuit 14 are "0100". In the reference resistor and switch array 12 which has received the higher-order code selection signals P0C, P1C, P2C and P3C "0100", the switches S11–13 of the lower-order reference voltage selection switch 5 are in on-state, while the switches S01–03, S21–23 and S31–33 are in off-state. As a result, respective voltage values which are obtained by dividing the voltage between Vr1c and Vr2c into four equal potentials by the reference resistors R11–R14 are input as the lower-order reference voltages Vr1f, Vr2f and Vr3f.

Since the logical level of the lower-order reference voltage initialization signal s9 (see FIG. 4(h)) which is input to the lower-order reference voltage initializing circuit 8 is low in the lower-order reference voltage decision period, the lower-order reference voltage input switches 20S1–20S3 of the lower-order reference voltage initializing circuit 8 are in on-state, while the lower-order reference voltage initialization switches 10S1–10S3 are in off-state, whereby the lower-order reference voltage initializing circuit 8 outputs as VR1F, VR2F and VR3F the lower-order reference voltages Vr1f, Vr2f and Vr3f which are selected in the reference resistor and switch array 12 on the basis of the higher-order code selection signals P0C, P1C, P2C and P3C, in stead of outputting the value of the initialization voltage Vrc 23. As a result, in the lower-order reference voltage decision period, the values of the lower-order reference voltages Vr1f, Vr2f and Vr3f are changed from the value of the initialization voltage Vrc 23, to the voltage values selected on the basis of the higher-order code selection signals P0C, P1C, P2C and P3C, resulting in small variations in voltage value.

In a lower-order comparison period (t4–t5 period), the respective voltage comparators 6 of the lower-order voltage comparator array 16 compare the outputs VR1F, VR2F and VR3F from the lower-order reference voltage initializing circuit 8, which are equal to the values of the lower-order reference voltages Vr1f, Vr2f and Vr3f output from the reference resistor and switch array 12, with the analog input voltage value vin which is held in the sampling period. Then, at a falling time of the lower-order comparison signal (see FIG. 4(g)) from the control signal generating circuit 9, the respective voltage comparators 6 output lower-order voltage comparison results C0F, C1F and C2F as the comparison results. Thereafter, on the receipt of the lower-order voltage comparison results C0F, C1F and C2F, the lower-order code selecting circuit 17 converts these comparison results into lower-order code selection signals P0F, P1F, P2F and P3F, and the lower-order coding circuit 18 outputs a two-bit lower-order binary code in accordance with the lower-order code selection signals P0F, P1F, P2F and P3F.

Then, the code compositing circuit 19 performs a logic operation on the two-bit higher-order binary code output from the higher-order coding circuit 15 and the two-bit lower-order binary code output from the lower-order coding circuit 18, to obtain a four-bit digital output from a digital output terminal 11.

As described above, according to the serial/parallel A/D converter of the first embodiment, there are provided the lower-order reference voltage initializing circuit 8 for initializing the lower-order reference voltages Vr1f, Vr2f and Vr3f from the reference resistor and switch array 12 by outputting a prescribed initialization voltage for an arbitrary period of time, and the initialization voltage Vrc 23. The control signal generating circuit 9 generates the lower-order reference voltage initialization signal s9 indicating a period during which initialization is performed by outputting a prescribed voltage as the lower-order reference voltage. Under the control of this lower-order reference voltage initialization signal s9, the lower-order reference voltage initializing circuit 8 outputs the value of the initialization voltage Vrc 23 in the sampling period, while outputting the lower-order reference voltages Vr1f, Vr2f and Vr3f from the reference resistor and switch array 12 in the periods other than the sampling period. Therefore, even when the analog input voltage Vin greatly varies in a period from a sampling period to the next sampling period and accordingly the lower-order reference voltages Vr1f, Vr2f and Vr3f are greatly varied, the value of the lower-order reference voltage can be initialized to a prescribed value of the initialization voltage Vrc 23 before the lower-order reference voltage is selected in the reference resistor and switch array 12 on the basis of the comparison results from the high comparator array 13, and the value of the lower-order reference voltage can be changed from the value of the initialization voltage Vrc 23 to a value of a new lower-order reference voltage in the lower-order reference voltage decision period, resulting in a small amount of variation of the lower-order reference voltage in the lower-order reference voltage decision period. Accordingly, it is possible to prevent the conventional problem that the lower-order reference voltages Vr1f, Vr2f and Vr3f are not stabilized even in the lower-order comparison period, whereby a serial/parallel A/D converter which is able to perform a high-speed and high-accuracy operation even when the analog input voltage Vin greatly varies can be realized.

In the first embodiment, the description has been given of the four-bit serial/parallel A/D converter which performs a logic operation on higher-order two bits and lower-order two bits, while the number of bits of the digital output that is generated by the serial/parallel A/D converter can be set arbitrarily, and the number of higher-order bits and lower-order bits can be also set arbitrarily.

Further, in the first embodiment, the serial/parallel A/D converter has a two-level construction, and generates a two-bit higher-order binary code and a two-bit lower-order binary code and obtains a four-bit digital output by performing a logic operation on the high-order and low-order binary codes. However, the serial/parallel A/D converter may have an n-level construction ("n" is an integer satisfying n≧2), and generate first to n-th binary codes and perform a logic operation on the first to n-th binary codes to obtain a digital output. In this case, the serial/parallel A/D converter requires n pieces of comparator arrays, n pieces of code selecting circuits, and n pieces of coding circuits, respectively. In each of the second to n-th comparator arrays, the initialization voltage Vrc 23 is input and held in the sampling period, and comparison is made between values of second to n-th reference voltages which are changed from the value of the initialization voltage Vrc 23 held to voltage values that are decided on the basis of comparison results in the first to (n−1)-th comparator arrays, and a value of an analog input voltage which is sampled in the sampling period.

Figure 5:
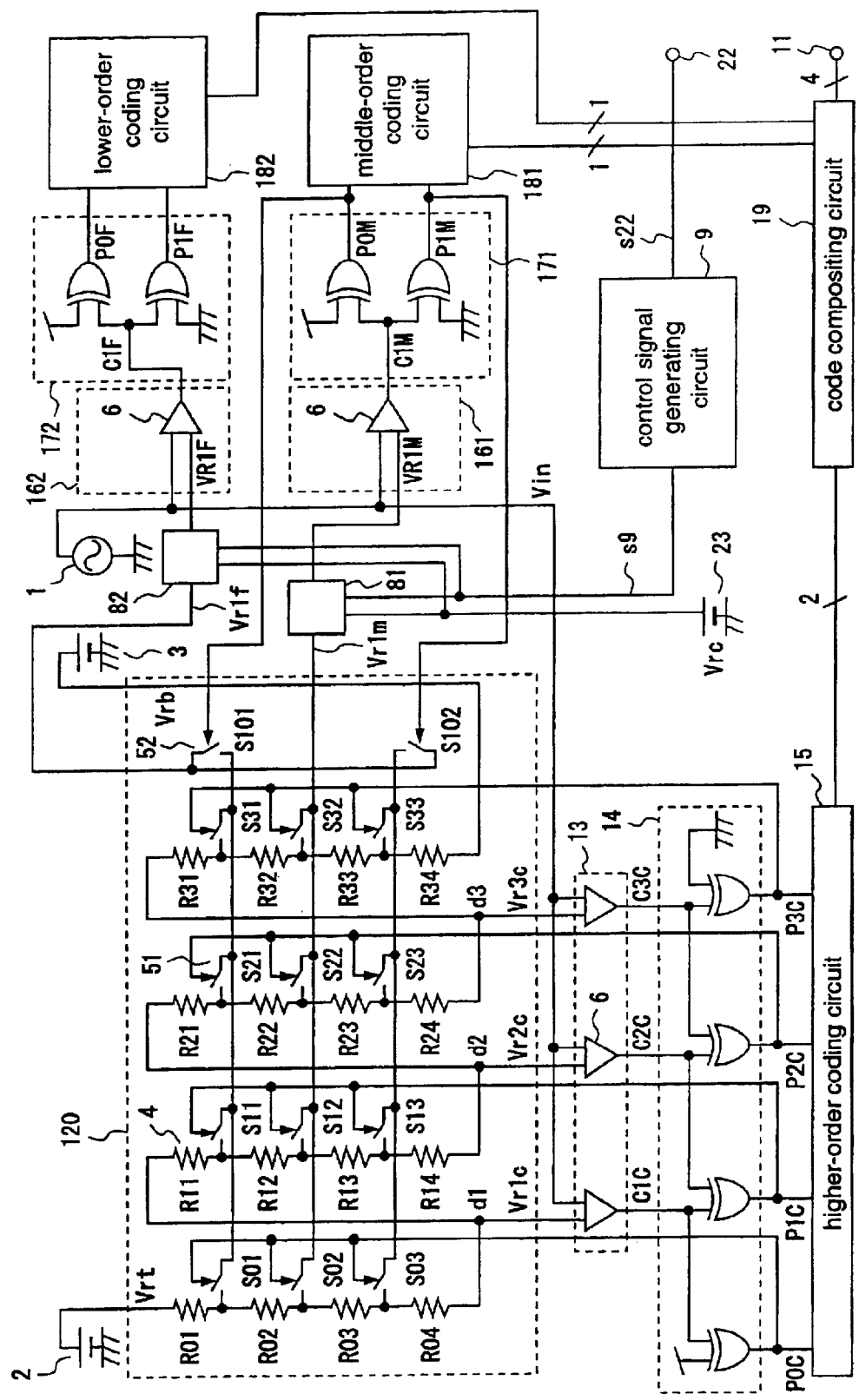
FIG. 5 is a diagram illustrating a construction of a four-bit three-level serial/parallel A/D converter according to the first embodiment of the invention.

As an example of a serial/parallel A/D converter of a multiple-level construction, a description will be given of a serial/parallel A/D converter of a three-level construction (i.e., n=3) as shown in FIG. 5, which performs a logic operation on a two-bit first binary code (hereinafter, referred to as a "higher-order code"), a one-bit second binary code (hereinafter, referred to as a "middle-order code"), and a one-bit third binary code (hereinafter, referred to as a "lower-order code"), to obtain a four-bit digital output.

With reference to FIG. 5, the four-bit serial/parallel A/D converter of a three-level construction comprises a reference resistor and switch array 120 which is connected between reference voltages 2 and 3, a higher-order voltage comparator array 13 for deciding a two-bit higher-order binary code, a higher-order code selecting circuit 14 which outputs higher-order code selection signals P0C–P3C on the basis of higher-order voltage comparison results C1C–C3C from the higher-order voltage comparator array 13, a higher-order coding circuit 15 which outputs a two-bit higher-order binary code according to the higher-order code selection signals, a middle-order voltage comparator array 161 for deciding a one-bit middle-order binary code, a middle-order code selecting circuit 171 which outputs middle-order code selection signals P0M and P1M on the basis of a middle-order code comparison result C1M from the middle-order voltage comparator array 161, a middle-order coding circuit 181 which outputs a one-bit middle-order binary code in accordance with the middle-order code selection signals, a lower-order voltage comparator array 162 for deciding a one-bit lower-order binary code, a lower-order code selecting circuit 172 which outputs lower-order code selection signals P0F and P1F on the basis of a lower-order voltage comparison result C1F from the lower-order voltage comparator array 162, a lower-order coding circuit 182 which outputs a one-bit lower-order binary code in accordance with the lower-order code selection signals, a code compositing circuit 19 which performs a logic operation on the two-bit higher-order binary code, the one-bit middle-order binary code, and the one-bit lower-order binary code to obtain a four-bit digital output, a control signal generating circuit 9 which generates various kinds of control signals, a middle-order reference voltage initializing circuit 81 which initializes a middle-order reference voltage Vr1$m$ which is input to the middle-order voltage comparator array 161 to a prescribed voltage value, a lower-order reference voltage initializing circuit 82 which initializes a lower-order reference voltage Vr1$f$ which is input to the lower-order voltage comparator array 162 to a prescribed voltage value, and an initialization voltage Vrc 23 which is input to the middle-order reference voltage initializing circuit 81 and the lower-order reference voltage initializing circuit 82. The reference resistor and switch array 120 includes a reference resistor 4 comprising resistors R01–R04, R11–R14, R21–R24, and R31–R34 having the same resistance value, for dividing the potential between the reference voltages 2 and 3 into 16 equal potentials; a middle-order reference voltage selection switch 51 comprising switches S01–S03, S11–S13, S21–S23, and S31–S33 provided at respective positions at which the potential is divided equally into sixteen, for selecting a middle-order reference voltage, which is controlled by the higher-order code selection signals; and a lower-order reference voltage selection switch 52 comprising switches S101 and S102 for selecting a lower-order reference voltage, which is controlled by the middle-order code selection signals.

The operation is as follows. In the sampling period, the analog input voltage Vin is held, and under the control of the lower-order reference voltage initialization signal s9 from the control signal generating circuit 9, the middle-order reference voltage initializing circuit 81 and the lower-order reference voltage initializing circuit 82 initialize the middle-order reference voltage Vr1$m$ and the lower-order reference voltages Vr1$f$ from the reference resistor and switch array 120, to a prescribed value of the initialization voltage Vrc 23, and output the initialized voltage values as VR1M and VR1F, respectively. Then, respective voltage comparators 6 of the higher-order voltage comparator array 13 compare the analog input voltage value Vin which is held in the sampling period, with higher-order reference voltage values Vr1$c$, Vr2$c$ and Vr3$c$, and output higher-order voltage comparison results C1C, C2C and C3C as comparison results. Thereafter, on the receipt of the higher-order voltage comparison results C1C, C2C and C3C, the higher-order code selecting circuit 14 converts these comparison results into higher-order code selection signals P0C, P1C, P2C and P3C, and the higher-order coding circuit 15 outputs a two-bit higher-order binary code in accordance with the higher-order code selection signals P0C, P1C, P2C and P3C.

Then, the on/off state of the middle-order reference voltage selection switch 51 in the reference resistor and switch array 120 is decided on the basis of the higher-order code selection signals P0C–P3C output from the higher-order code selecting circuit 14, thereby switching the value of the middle-order reference voltage Vr1$m$. A comparator 6 of the middle-order voltage comparator array 161 compares the output VR1M from the middle-order reference voltage initializing circuit 81, having a value which is equal to that of the middle-order reference voltage Vr1$m$ output from the reference resistor and switch array 120, with the analog input voltage value Vin held in the sampling period, and outputs a middle-order voltage comparison result C1M as a comparison result to the middle-order code selecting circuit 171. The middle-order code selecting circuit 171 converts this comparison result into the middle-order code selection signals P0M and P1M. Then, the middle-order coding circuit 181 outputs a one-bit middle-order binary code in accordance with the middle-order code selection signals P0M and P1M. Further, the on/off state of the lower-order reference voltage selection switch 52 in the reference resistor and switch array 120 is decided on the basis of the middle-order code selection signals P0M and P1M output from the middle-order code selecting circuit 171, thereby changing the value of the lower-order reference voltage Vr1$f$. A comparator 6 of the lower-order voltage comparator array 162 compares the output VR1F from the lower-order reference voltage initializing circuit 82, having a value which is equal to that of the lower-order reference voltage Vr1$f$ output from the reference resistor and switch array 120, with the analog input voltage value Vin held in the sampling period, and outputs a lower-order voltage comparison result C1F as a comparison result to the lower-order code selecting circuit 172. The lower-order code selecting circuit 172 converts this comparison result into the lower-order code selection signals P0F and P1F. Then, the lower-order coding circuit 182 outputs a one-bit lower-order binary code in accordance with the lower-order code selection signals P0F and P1F.

In the first embodiment, the respective switches constituting the lower-order reference voltage initializing circuit 8 are in one-state when the logical level of the input lower-order reference voltage initialization signal s9 is high while the switches are in off-state when the logical level is low, but the logical level for the on/off control of the switches can be decided arbitrarily. Further, in the first embodiment the lower-order reference voltage initializing circuit 8 comprises the inverting circuit and the switches as shown in FIG. 2, while the lower-order reference voltage initializing circuit 8 may comprise other logic circuits. Also, while the control signal generating circuit 9 comprises the inverting circuits, the delay circuit, and the AND circuits as shown in FIG. 3, the control signal generating circuit 9 may comprise other logic circuits.

[Embodiment 2]

Figure 6:
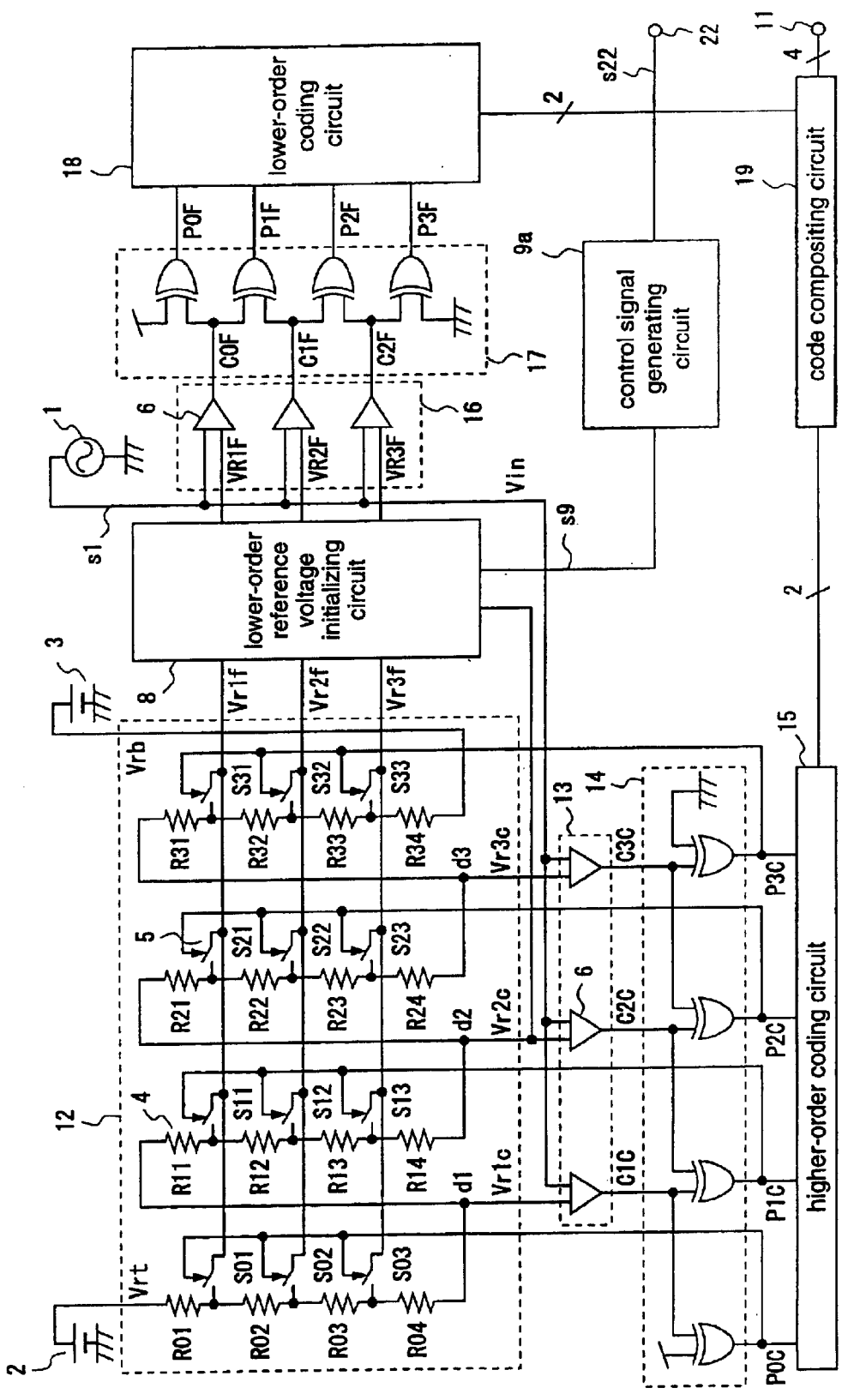
FIG. 6 is a diagram illustrating a construction of a four-bit serial/parallel A/D converter according to a second embodiment of the present invention.

Hereinafter, a serial/parallel A/D converter according to a second embodiment will be described with reference to FIGS. 6–8.

In the above-described first embodiment, the serial/parallel A/D converter is provided with the initialization voltage Vrc 23 for initializing a lower-order reference voltage, so that the lower-order reference voltage is initialized to the value of the initialization voltage Vrc 23 in the lower-order reference voltage initializing circuit 8, while in the second embodiment an output from reference resistor and switch array 12a is connected to a lower-order reference voltage initializing circuit 8, so that the lower-order reference voltage initializing circuit 8 initializes lower-order reference voltages Vr1f, Vr2f and Vr3f to the output from the reference resistor and switch array 12 in an arbitrary period from the start of a sampling period to the start of a lower-order comparison period.

Initially, the construction of the four-bit serial/parallel A/D converter according to the second embodiment will be described with reference to FIG. 6.

In the serial/parallel A/D converter of the second embodiment, in stead of the initialization voltage Vrc 23 as shown in FIG. 1 for the first embodiment, a point d2 at which the potential difference between reference voltages 2 and 3 in the reference resistor and switch array 12 is divided into two equal potentials is connected to an input terminal of the lower-order reference voltage initializing circuit 8, and the lower-order reference voltages Vr1f, Vr2f and Vr3f are initialized to a voltage value Vr2c at the point d2 under the control of a lower-order reference voltage initialization signal s9 from a control signal generating circuit 9a.

A detailed construction of the lower-order reference voltage initializing circuit 8 is different from that shown in FIG. 2 for the first embodiment only in that one terminals of lower-order reference voltage initialization switches 10S1–10S3 are connected in common to the point d2 in the reference resistor and switch array 12.

In the second embodiment, one terminal of each of the lower-order reference voltage initialization switches 10S1–10S3 is connected to the point d2 in the reference resistor and switch array 12, while one terminal of each of the lower-order reference voltage initialization switches 10S1–10S3 may be connected to any points d1–d3 in the reference resistor and switch array 12, because a prescribed voltage value to which the lower-order reference voltages Vr1f, Vr2f and Vr3f are initialized may be a voltage value between the reference voltages 2 and 3 as described in the first embodiment. However, as described in the first embodiment, since an intermediate voltage value between the reference voltages 2 and 3 is preferable as the prescribed voltage value to which the lower-order reference voltages Vr1f, Vr2f and Vr3f are initialized, it is preferable in the construction shown in FIG. 6 that the input terminal of the lower-order reference voltage initializing circuit 8 is connected to the point d2 in the reference resistor and switch array 12 at which the potential difference between the reference voltages 2 and 3 is divided into two. It is also possible that the point d2 is connected to the point d3.

The control signal generating circuit 9a generates various kinds of control signals for controlling the operational timing of the serial/parallel A/D converter, i.e., a sampling signal, a higher-order comparison signal, a lower-order reference voltage decision signal, a lower-order comparison signal, and a lower-order reference voltage initialization signal, on the basis of a clock s22 that is input from a clock terminal 22, as described for the first embodiment.

An initialization period indicated by the lower-order reference voltage initialization signal s9 may be an arbitrary period from the start of sampling of an analog input voltage Vin in respective comparators 6 of a higher-order voltage comparator array 13 and a lower-order voltage comparator array 16 to the start of a lower-order voltage comparison operation in the lower-order voltage comparator array 16 in the serial/parallel A/D converter, as described in the first embodiment. However, in this second embodiment, the initialization period is a higher-order comparison period during which the respective comparators 6 of the higher-order voltage comparator array 13 compare the analog input voltage value Vin with the higher-order reference voltages Vr1c, Vr2c and Vr3c.

A detailed description will be given of the construction of the control signal generating circuit 9a in the case where the initialization period is the higher-order comparison period as described above. For example, as shown in FIG. 7, the control signal generating circuit 9a comprises first and second inverting circuits 26a and 26b, a delay circuit 25, and AND circuits 27a–27d. When the clock s22 from the clock terminal 22 is input to the first inverting circuit 26a, the first inverting circuit 26a outputs an inverted signal of the clock s22, the delay circuit 25 receives the inverted signal of the clock s22 and delays the inverted signal of the clock s22, and the second inverting circuit 26b outputs an inverted signal of the signal output from the delay circuit 25. The AND circuits 27a–27d receive the clock s22 from the clock terminal 22, the output signal from the fist inverting circuit 26a, the output signal from the delay circuit 25, and the output signal from the second inverting circuit 26b, and composite these signals to output the sampling signal, the lower-order reference voltage initialization signal s9, the higher-order comparison signal, the lower-order reference voltage decision signal, and the lower-order comparison signal. In the second embodiment, since the initialization period is the higher-order comparison period, the higher-order comparison signal is identical to the lower-order reference voltage initialization signal s9.

Other constitutions are the same as those of the serial/parallel A/D converter as shown in FIG. 1 for the first embodiment, and their descriptions are not given.

Next, the operation of the four-bit serial/parallel A/D converter according to the second embodiment will be described with reference to FIG. 8. FIG. 8 is a timing chart illustrating the operation of the serial/parallel A/D converter of the second embodiment. In this figure, reference character (a) shows a clock input, (b) shows a status of the higher-order voltage comparator array, (c) shows a status of the lower-order voltage comparator array, (d) shows a sampling signal, (e) shows a higher-order comparison signal, (f) shows a lower-order reference voltage decision signal, (g) shows a lower-order comparison signal, (h) shows a lower-order reference voltage initialization signal, (i) shows a status of a lower-order reference voltage, (j) shows an analog input voltage, (k) shows an output from the lower-order reference voltage initializing circuit, and (l) shows an output from the lower-order voltage comparator array.

Initially, in a sampling period (t1–t2 period), the higher-order voltage comparator array 13 and the lower-order voltage comparator array 16 are simultaneously connected to the analog input terminal 1, and at a falling time of the sampling signal (see FIG. 8(d)) from the control signal generating circuit 9a, the respective comparators 6 of the higher-order voltage comparator array 13 and the lower-order voltage comparator array 16 hold an equal analog input voltage Vin of an analog input signal s1 which is input from the analog input terminal 1.

Then, in a higher-order comparison period (t2–t3 period), the respective voltage comparators 6 of the higher-order voltage comparator array 13 compare the value of the analog input voltage Vin which is held in the sampling period, with the values of the higher-order reference voltages Vr1c, Vr2c and Vr3c. At a falling time of the higher-order comparison signal (see FIG. 8(e)) from the control signal generating circuit 9a, the respective voltage comparators 6 output higher-order voltage comparison results C1C, C2C and C3C as comparison results.

Since the higher-order comparison period is also the initialization period (see FIG. 8(i)), at a falling time of the lower-order reference voltage initialization signal s9 (see FIG. 8(h)) from the control signal generating circuit 9a, the lower-order reference voltage initializing circuit 8 initializes the respective lower-order reference voltages Vr1f, Vr2f and Vr3f from the reference resistor and switch array 12, to the voltage value Vr2c at the point d2 in the reference resistor and switch array 12, and outputs the initialized voltages as VR1F, VR2F and VR3F (see FIG. 8(k)). Specifically, at a rising time of the lower-order reference voltage initialization signal s9 from the control signal generating circuit 9a, the lower-order reference voltage initialization switches 10S1–10S3 of the lower-order reference voltage initializing circuit 8 are in on-state, while lower-order reference voltage input switches 20S1–20S3 are in off-state, whereby the lower-order reference voltage initializing circuit 8 outputs the voltage value Vr2c at the point d2 in the reference resistor and switch array 12, instead of the respective values of the lower-order reference voltages Vr1f, Vr2f and Vr3f from the reference resistor and switch array 12, as VR1f, VR2f and VR3f. Thereafter, on the receipt of the higher-order voltage comparison results C1C, C2C and C3C, a higher-order code selecting circuit 14 converts these comparison results into higher-order code selection signals P0C, P1C, P2C and P3C, and a higher-order coding circuit 15 outputs a two-bit higher-order binary code in accordance with the higher-order code selection signals P0C, P1C, P2C and P3C.

Next, in a lower-order reference voltage decision period (t3–t4 period), at a falling time of the lower-order reference voltage decision signal (see FIG. 8(f)) from the control signal generating circuit 9a, the on/off state of a lower-order reference voltage selection switch 5 in the reference resistor and switch array 12 is selected on the basis of the higher-order code selection signals P0C, P1C, P2c and P3C which are output from the higher-order code selecting circuit 14, thereby switching the values of the lower-order reference voltages Vr1f, Vr2f and Vr3f. To be specific, for example when the analog input voltage value Vin is a value between the higher-order reference voltages Vr2c and Vr3c (Vr2c>Vin>Vr3c), the higher-order voltage comparison results C1C, C2C and C3C output from the higher-order voltage comparator array 13 are "010", and the higher-order code selection signals P0C, P1C, P2C and P3C output from the higher-order code selecting circuit 14 are "0010". In the reference resistor and switch array 12 which has received the higher-order code selection signals P0C, P1C, P2C and P3C "0010", the switches S21–23 of the lower-order reference voltage selection switch 5 are in on-state, while the switches S01–03, S11–13 and S31–33 are in off-state. As a result, respective voltage values which are obtained by dividing the voltage between Vr2c and Vr3c into four equal potentials by reference resistors R21–R24 are input as the lower-order reference voltages Vr1f, Vr2f and Vr3f.

Since the logical level of the lower-order reference voltage initialization signal s9 (see FIG. 8(h)) is low in the lower-order reference voltage decision period, the lower-order reference voltage input switches 20S1–20S3 of the lower-order reference voltage initializing circuit 8 are in on-state, while the lower-order reference voltage initialization switches 10S1–10S3 are in off-state, whereby the lower-order reference voltage initializing circuit 8 outputs as VR1F, VR2F and VR3F the lower-order reference voltages Vr1f, Vr2f and Vr3f which are selected by the reference resistor and switch array 12 on the basis of the higher-order code selection signals P0C, P1C, P2C and P3C, in stead of outputting the voltage value Vr2c at the point d2 in the reference resistor and switch array 12. As a result, in the lower-order reference voltage decision period, the values of the lower-order reference voltages Vr1f, Vr2f and Vr3f are changed from the voltage value Vr2c at the point d2 in the reference resistor and switch array 12 to the voltage values selected on the basis of the higher-order code selection signals P0C, P1C, P2C and P3C, resulting in a small variation in voltage value.

The operation in a following lower-order comparison period (t4–t5 period) is the same as that described in the first embodiment. That is, the respective voltage comparators 6 of the lower-order voltage comparator array 16 compare the outputs VR1F, VR2F and VR3F from the lower-order reference voltage initializing circuit 8, whose values are equal to those of the lower-order reference voltages Vr1f, Vr2f and Vr3f which are output from the reference resistor and switch array 12, with the value of the analog input voltage Vin which is held in the sampling period, and at a falling time of the lower-order comparison signal from the control signal generating circuit 9a, the respective voltage comparators 6 output lower-order voltage comparison results C0F, C1F and C2F, respectively as the comparison results. Then, on the receipt of the lower-order voltage comparison results C0F, C1F and C2F, a lower-order code selecting circuit 17 converts these comparison results into lower-order code selection signals P0F, P1F, P2F and P3F, and a lower-order coding circuit 18 outputs a two-bit lower-order binary code according to the lower-order code selection signals P0F, P1F, P2F and P3F.

Thereafter, a code compositing circuit 19 performs a logic operation on the two-bit higher-order binary code output from the higher-order coding circuit 15 and the two-bit lower-order binary code output from the lower-order coding circuit 18, to obtain a four-bit digital output from a digital output terminal 11.

As described above, according to the serial/parallel A/D converter of the second embodiment, the point d2 in the reference resistor and switch array 12 is connected to the lower-order reference voltage initializing circuit 8 for initializing the lower-order reference voltages Vr1f, Vr2f and Vr3f from the reference resistor and switch array 12 by outputting a prescribed initialization voltage for an arbitrary period of time. Under the control of the lower-order reference voltage initialization signal s9 which is generated by the control signal generating circuit 9a, the lower-order reference voltage initializing circuit 8 outputs the voltage value Vr2c at the point d2 in the higher-order comparison period, and outputs the lower-order reference voltages Vr1f, Vr2f and Vr3f from the reference resistor and switch array 12 in the periods other than the higher-order comparison period. Therefore, the serial/parallel A/D converter requires no initialization voltage Vrc 23, thereby simplifying the construction of the serial/parallel A/D converter, as well as achieving the effects as described in the first embodiment.

Further, according to the second embodiment, the initialization of the lower-order reference voltages Vr1f, Vr2f and Vr3f is performed not in the sampling period but in the higher-order comparison period. Thus, when the analog input voltage Vin is held in the respective voltage comparators 6 in the high voltage comparator array 13 and the lower-order voltage comparator array 16, the values of the lower-order reference voltages do not vary (see FIG. 8(h)), whereby a stable sampling operation can be performed without being affected by noises that are caused by changes in the lower-order reference voltages.

In the second embodiment, the description has been given of the four-bit serial/parallel A/D converter which performs a logic operation on higher-order two bits and lower-order two bits, while the number of bits of the digital output that is generated by the serial/parallel A/D converter can be set arbitrarily, and the number of higher-order bits and lower-order bits can be also set arbitrarily.

Further, in the second embodiment, the serial/parallel A/D converter has a two-level construction, and performs a logic operation on higher-order two bits and lower-order two bits to obtain a four-bit digital output, while the serial/parallel A/D converter does not need to have a two-level construction, and may have an n-level construction ("n" is an integer satisfying n≧2) as described in the first embodiment. In such case, the serial/parallel A/D converter requires n pieces of comparator arrays, n pieces of code selecting circuits, and n pieces of coding circuits, respectively. In each of the second to n-th comparator arrays, the voltage value Vr2c at the point d2 in the reference resistor and switch array 12 is input and held in the comparison period in the first to (n−1)-th comparator arrays, and comparison is made between values of second to n-th reference voltages which are changed from the value of the initialization voltage held to voltage values that are decided on the basis of comparison results in the first to (n−1)-th comparator arrays, and a value of an analog input voltage which is sampled in the sampling period.

Further, in the second embodiment, the respective switches constituting the lower-order reference voltage initializing circuit 8 are in on-state when the logical level of the lower-order reference voltage initialization signal s9 input is high, while the switches are in off-state when the logical level is low. However, the logical level for the on/off control of the switches can be arbitrarily decided.

Figure 7:
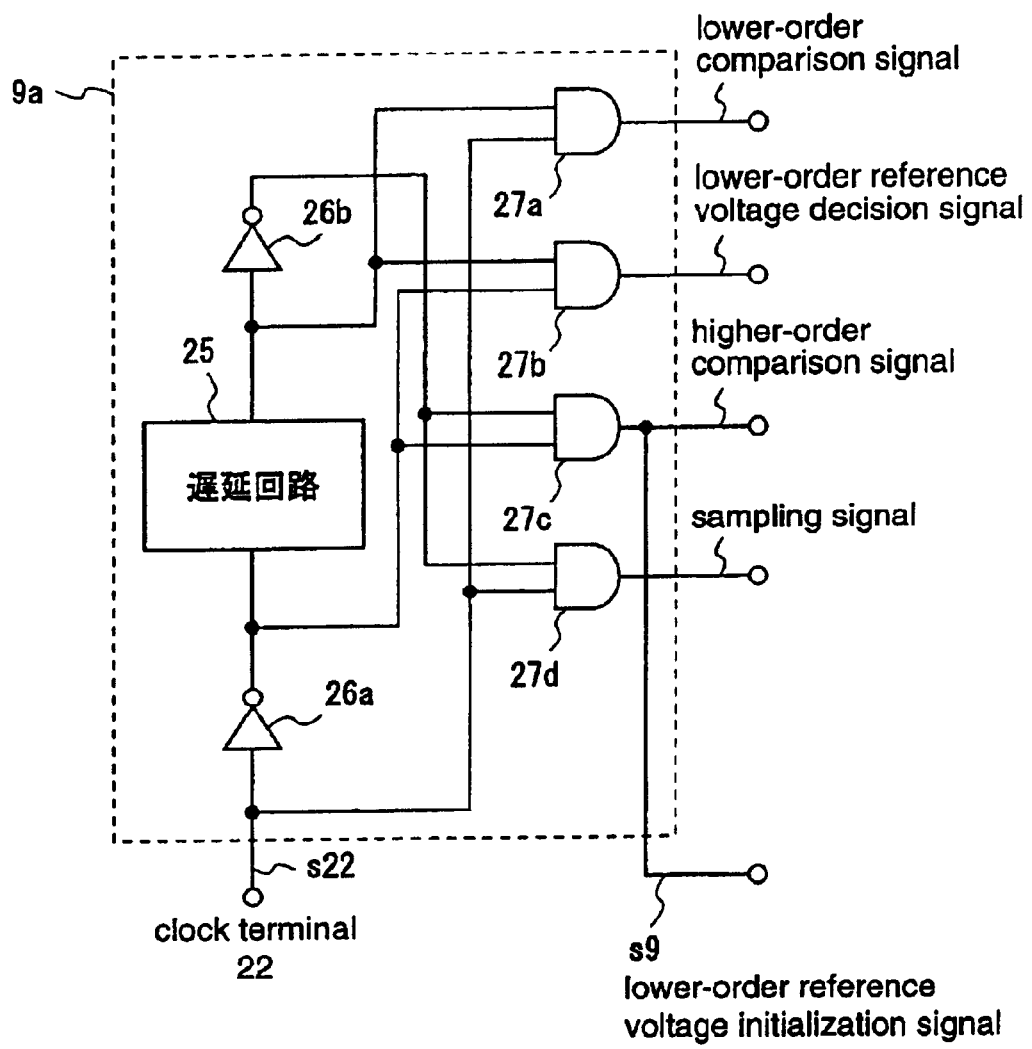
FIG. 7 is a diagram illustrating a construction of a control signal generating circuit of the serial/parallel A/D converter according to the second embodiment of the invention.
Figure 8:
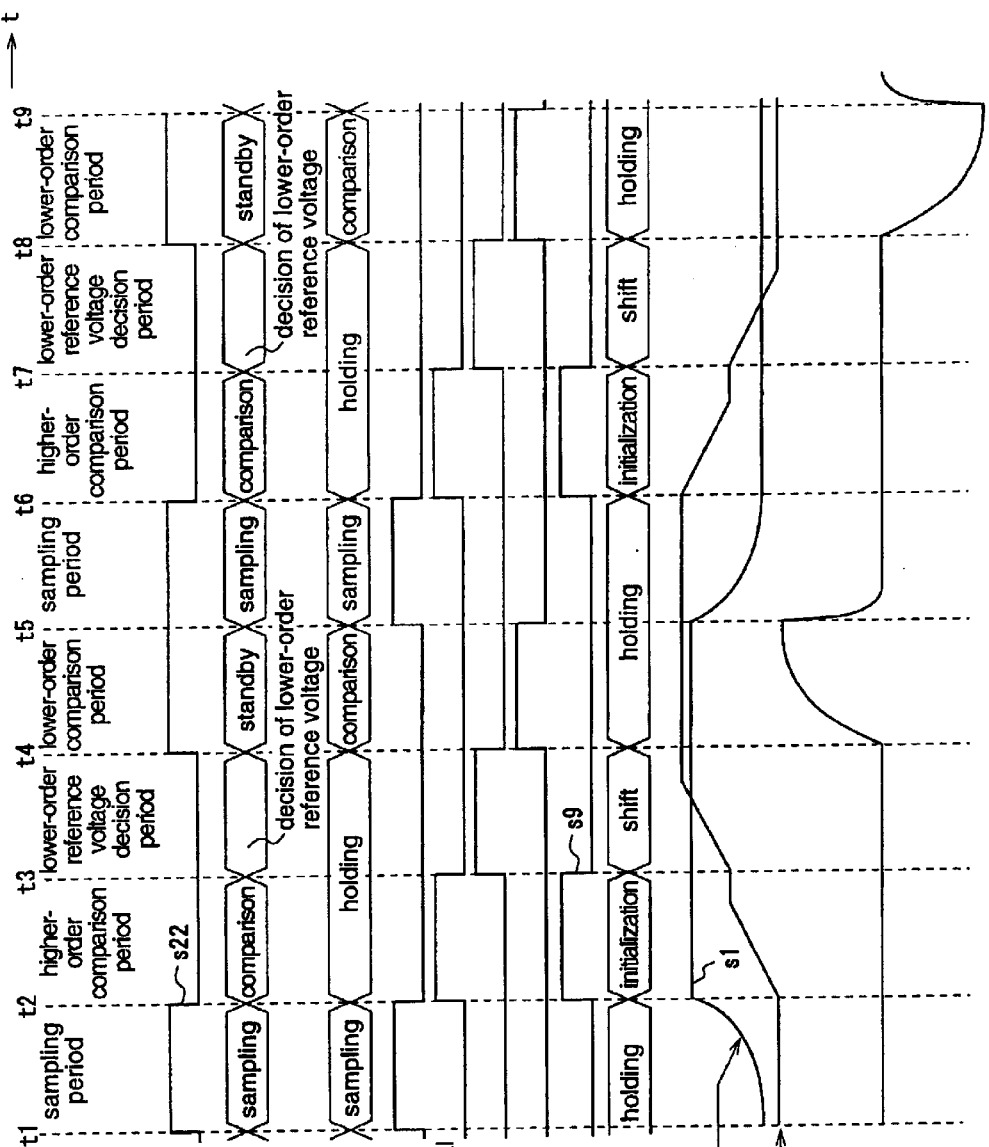
FIGS. 8(a)–8(l) are a timing chart for the serial/parallel A/D converter according to the second embodiment of the invention.

Furthermore, while in the second embodiment the control signal generating circuit 9a comprises the inverting circuits, the delay circuit and the AND circuits as shown in FIG. 7, the control signal generating circuit 9a may comprise other logic circuits.

Moreover, in the second embodiment, the lower-order reference voltages Vr1f, Vr2f and Vr3f are initialized to the voltage value Vr2c at the point d2 in the reference resistor and switch array 12 in the higher-order comparison period. However, it is also possible to construct the control signal generating circuit according to the second embodiment like the control signal generating circuit 9 described in the first embodiment, so that the initialization is performed in the sampling period as shown in the first embodiment with reference to FIG. 4. On the contrary, the control signal generating circuit in the serial/parallel A/D converter according to the first embodiment may be constructed like the control signal generating circuit 9a as described in the second embodiment, so that the lower-order reference voltages Vr1f, Vr2f and Vr3f are initialized to the value of the initialization voltage Vrc 23 in the comparison period as shown in the second embodiment with reference to FIG. 8.

[Embodiment 3]

Figure 9:
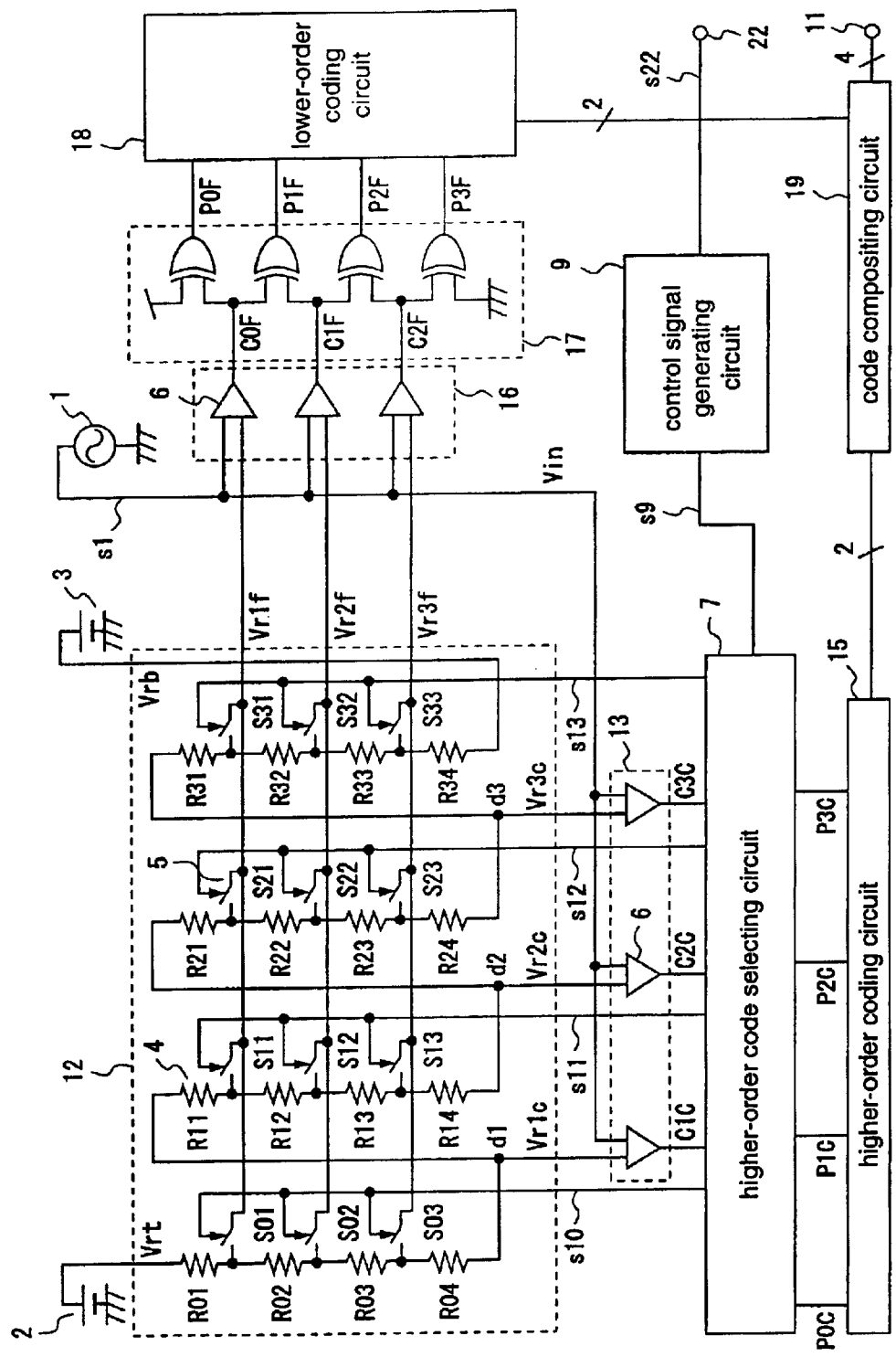
FIG. 9 is a diagram illustrating a construction of a four-bit serial/parallel A/D converter according to a third embodiment of the present invention.

Hereinafter, a serial/parallel A/D converter according to a third embodiment will be described wit reference to FIGS. 9–11.

In the above-described embodiments, initialization is performed by the lower-order reference voltage initializing circuit for initializing a lower-order reference voltage output from the reference resistor and switch array 12 while, in the third embodiment, the lower-order reference voltage is initialized to a prescribed voltage value by outputting an initialization voltage selection signal for fixing the on/off state of a lower-order reference voltage selection switch 5 of the reference resistor and switch array 12, to a prescribed state for an arbitrary period of time.

Initially, the construction of the four-bit serial/parallel A/D converter according to the third embodiment will be described with reference to FIG. 9.

The serial/parallel A/D converter according to the third embodiment is not provided with the lower-order reference voltage initializing circuit 8 as shown in the above-described embodiments, and has, in stead of the above-described higher-order code selecting circuit 14, a higher-order code selecting circuit 7 which outputs higher-order code selection signals P0C–P3C on the basis of higher-order voltage comparison results C1C–C3C from a higher-order voltage comparator array 13, as well as outputs initialization voltage selection signals s10–s13 for setting the on/off state of the lower-order reference voltage selection switch 5 of the reference resistor and switch array 12 at a prescribed state on the basis of a lower-order reference voltage initialization signal s9 from a control signal generating circuit 9 for a prescribed period of time, while setting the on/off state of the lower-order reference voltage selection switch 5 on the basis of the higher-order voltage comparison results C1C–C3C for periods other than described above, so that the on/off state of the lower-order reference voltage selection switch 5 of the reference resistor and switch array 12 is kept in a prescribed state for an arbitrary period of time, thereby initializing the value of the lower-order reference voltage.

Hereinafter, the construction of the higher-order code selecting circuit 7 will be described in detail with reference to FIG. 10. For example, as shown in FIG. 10, the higher-order code selecting circuit 7 comprises an inverting circuit, exclusive-OR circuits, an OR circuit, and AND circuits. An input terminal of each of the exclusive-OR circuits is connected to the higher-order voltage comparison result C1C, C2c or C3C from the higher-order voltage comparator array 13. One terminals of the OR circuit and each of the AND circuits are connected to output terminals of the exclusive-OR circuits, and the other terminals are connected to the lower-order reference voltage initialization signal s9 from the control signal generating circuit 9 or the lower-order reference voltage initialization signal s9 through the inverting circuit.

In the initialization period, i.e., when the logical level of the lower-order reference voltage initialization signal s9 is high, the so-constructed higher-order code selecting circuit 7 outputs the higher-order code selection signals P0C–P3C to a higher-order coding circuit 15, as well as outputs specific initialization voltage selection signals s10–s13 for setting on/off of the lower-order reference voltage selection switch 5 in a prescribed state, to the reference resistor and switch array 12. For example, when it is assumed that the above-mentioned prescribed state is a state where the initialization voltage selection signal s12 is high and the initialization voltage selection signals s10, s11 and s13 are low, switches S21–S23 of the lower-order reference voltage selection switch 5 in the reference resistor and switch array 12 are fixed in on-state, while switches S01–S03, S11–S13 and S31–S33 are fixed in off-state during the initialization period, whereby the lower-order reference voltages Vr1*f*, Vr2*f* and Vr3*f* take voltage values which are obtained by dividing the voltage between Vr2*c* and Vr3*c* into four equal potentials by reference resistors R21–R24. On the other hand, in periods other than the initialization period, i.e., when the logical level of the lower-order reference voltage initialization signal s9 is low, the higher-order code selecting circuit 7 outputs the value which is equal to the values of the higher-order code selection signals P0C–P3C, to the reference resistor and switch array 12 and the higher-order coding circuit 15, so that the on/off state of the lower-order reference voltage selection switch 5 of the reference resistor and switch array 12 is selected on the basis of the higher-order code selection signals P0C–P3C, whereby the lower-order reference voltages Vr1*f*, Vr2*f* and Vr3*f* based on the higher-order code selection signals are output.

As shown in the above-described embodiments, the control signal generating circuit 9 generates a sampling signal, a higher-order comparison signal, a lower-order reference voltage decision signal, and a lower-order comparison signal for controlling the operational timing of the serial/parallel A/D converter, as well as the lower-order reference voltage initialization signal s9 which indicates a period during which initialization is performed by outputting a prescribed voltage as the lower-order reference voltage. As described in the above-mentioned embodiments, the initialization period indicated by the lower-order reference voltage initialization signal s9 may be an arbitrary period from the start of sampling of an analog input voltage Vin in respective comparators 6 of the higher-order voltage comparator array 13 and a low-order voltage comparator array 16 until the start of a lower-order voltage comparison operation in the lower-order voltage comparator array 16 in the serial/parallel A/D converter. Further, in this third embodiment, the control signal generating circuit 9 is constructed as described for the first embodiment in FIG. 3, and the lower-order reference voltages Vr1*f*, Vr2*f* and Vr3*f* are initialized in a sampling period during which the analog input voltage Vin is held in the respective voltage comparators 6 of the higher-order voltage comparator array 13 and the lower-order voltage comparator array 16.

Next, the operation of the four-bit serial/parallel A/D converter according to the third embodiment will be described with reference to FIG. 11. FIG. 11 is a timing chart illustrating the operation of the serial/parallel A/D converter of the third embodiment. In the drawing, reference character (a) shows a clock input, (b) shows a status of the higher-order voltage comparator array, (c) shows a status of the lower-order voltage comparator array, (d) shows a sampling signal, (e) shows a higher-order comparison signal, (f) shows a lower-order reference voltage decision signal, (g) shows a lower-order comparison signal, (h) shows a lower-order reference voltage initialization signal, (i) shows a status of a lower-order reference voltage, (j) shows an analog input voltage, (k) shows a lower-order reference voltage, and (l) shows an output from the lower-order voltage comparator array.

Figure 11:
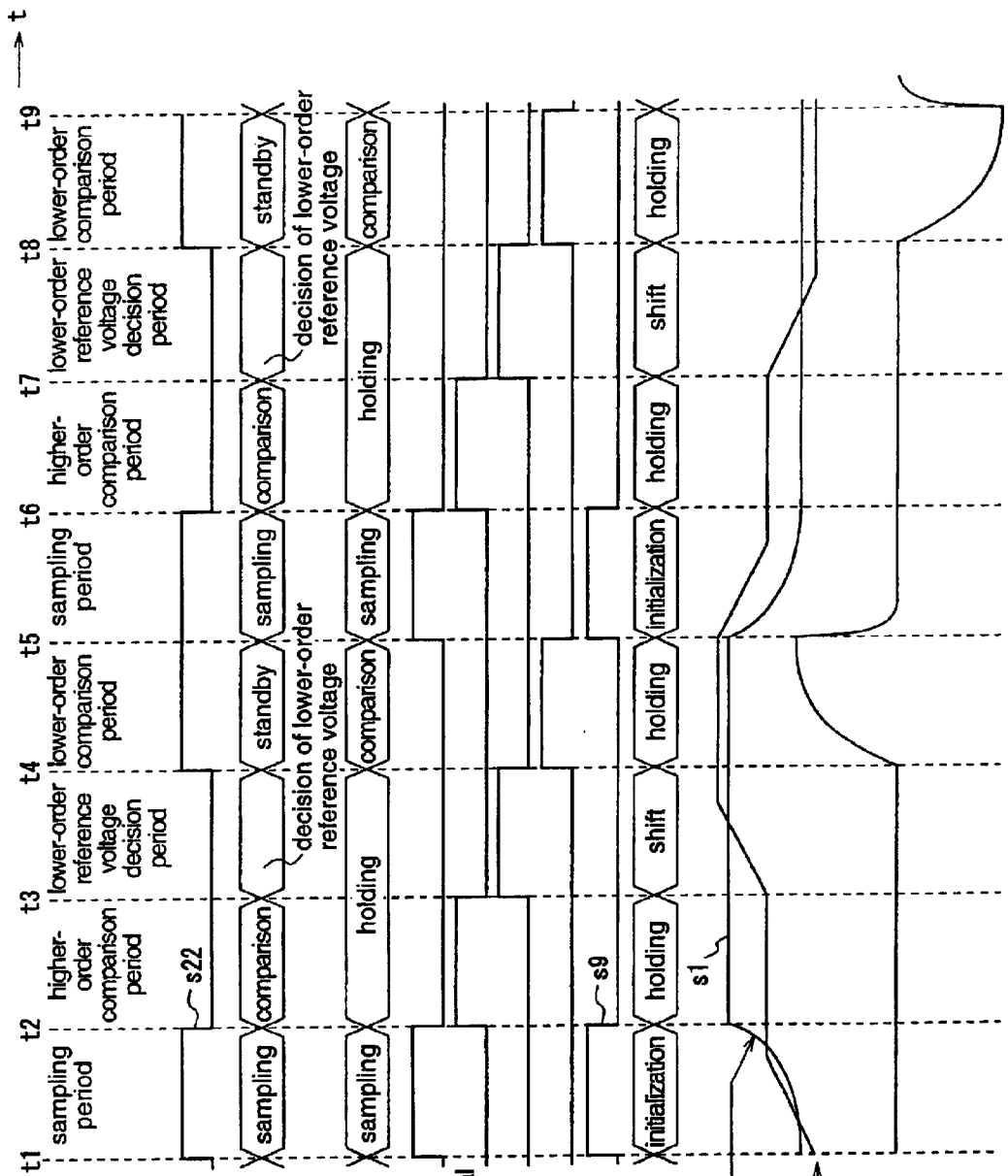
FIGS. 11(a)–11(l) are a timing chart for the serial/parallel A/D converter according to the third embodiment of the invention.

Initially, in the sampling period (t1–t2 period), the higher-order voltage comparator array 13 and the lower-order voltage comparator array 16 are simultaneously connected to an analog input terminal 1, and at a falling time of the sampling signal (see FIG. 11(*d*)) from the control signal generating circuit 9, the respective voltage comparators 6 of the higher-order voltage comparator array 13 and the lower-order voltage comparator array 16 hold an equal analog input voltage Vin of an analog input signal s1 which is input from the analog input terminal 1.

Since the sampling period is also the period for initializing the lower-order reference voltage at the same time (see FIG. 11(*i*)), at a falling time of the lower-order reference voltage initialization signal s9 (see FIG. 11(*h*)) from the control signal generating circuit 9, the higher-order coding circuit 7 outputs predetermined initialization voltage selection signals s10–s13 to the reference resistor and switch array 12. For example, when the logical level of the initialization voltage selection signal s12 is fixed high, while the logical levels of the initialization voltage selection signals s10, s11 and s13 are fixed low in the initialization period as described above, the switches S21–S23 of the lower-order reference voltage selection switch 5 in the reference resistor and switch array 12 are fixed in on-state, while the switches S01–S03, S11–S13 and S31–S33 are fixed in off-state, whereby the respective lower-order reference voltages Vr1*f*, Vr2*f* and Vr3*f* from the reference resistor and switch array 12 are output (see FIG. 11(*k*)).

Then, in a higher-order comparison period (t2–t3 period), the respective voltage comparators 6 of the higher-order voltage comparator array 13 compare the analog input voltage value Vin which is held in the sampling period, with the higher-order reference voltage values Vr1*c*, Vr2*c* and Vr3*c*. At a falling time of the higher-order comparison signal (see FIG. 11(*e*)) from the control signal generating circuit 9, the respective voltage comparators 6 output the higher-order voltage comparison results C1C, C2C and C3C as comparison results. During this period, the lower-order reference voltages which are initialized in the sampling period are held in the respective voltage comparators 6 of the lower-order voltage comparator array 16 (see FIG. 11(*h*)). Thereafter, on the receipt of the higher-order voltage comparison results C1C, C2C and C3C, the higher-order code selecting circuit 7 converts these comparison results into the higher-order code selection signals P0C, P1C, P2C and P3C, and the higher-order coding circuit 15 outputs a two-bit higher-order binary code according to the higher-order code selection signals P0C, P1C, P2C and P3C.

During this higher-order comparison period, the prescribed voltage value which is input to the respective voltage comparators 6 of the lower-order voltage comparator array 16 in the initialization period (sampling period) is held (see FIG. 11(*i*)(*k*)).

Then, in a lower-order reference voltage decision period (t3–t4 period), the logical level of the lower-order reference voltage initialization signal s9 from the control signal generating circuit 9 turns in a low logical level, and accordingly the initialization voltage selection signals s10–s13 have the same values as those of the higher-order code selection signals P0C–P3C which are converted from the higher-order voltage comparison results C1C–C3C by the higher-order code selecting circuit 7. Consequently, at a rising time of the lower-order reference voltage initialization signal s9, the on/off state of the lower-order reference voltage selection switch 5 in the reference resistor and switch array 12 is decided on the basis of the initialization voltage selection signals s10–s13 which have the same values as those of the higher-order code selection signals P0C–P3C output from the higher-order code selecting circuit 7, from the state where the switches S21–S23 of the lower-order reference voltage selection switch 5 in the reference resistor and switch array 12 are in on-state, while the switches S01–S03, S11–S13 and S31–S33 are in off-state, thereby switching the lower-order reference voltage values Vr1f, Vr2f and Vr3f. To be specific, for example when the analog input voltage value Vin is a voltage value between the higher-order reference voltage Vr3c and the reference voltage 3 (Vr3c>Vin>Vrb), the higher-order voltage comparison results C1C, C2C and C3C which are output from the higher-order voltage comparator array 13 are "001", and at that time the initialization voltage selection signals s10, s11, s12 and s13 which have the same values as those of the higher-order code selection signals P0C–P3C output from the higher-order code selecting circuit 7 are "0001". In the reference resistor and switch array 12 which has received the higher-order code selection P0C, P1C, P2C and P3C "0001", the switches S31–33 of the lower-order reference voltage selection switch 5 are in on-state, while the switches S01–03, S11–13 and S21–23 are in off-state. As a result, the lower-order reference voltages Vr1f, Vr2f and Vr3f having respective voltage values which are obtained by dividing the voltage between Vr3c and Vrb into four equal potentials by the reference resistors R31–R34 are input to the respective voltage comparators 6 of the lower-order voltage comparator array 16. Consequently, in the lower-order reference voltage decision period, the lower-order reference voltage values Vr1f, Vr2f and Vr3f are changed from the prescribed voltage value which is selected on the basis of the initialization voltage selection signals s10–s13, to the voltage values selected on the basis of the higher-order code selection signals P0C, P1C, P2C and P3C, resulting in a small variation in voltage value.

Next, in a lower-order comparison period (t4–t5 period), the respective voltage comparators 6 of the lower-order voltage comparator array 16 compare the values of the lower-order reference voltages Vr1f, Vr2f and Vr3f which are output from the reference resistor and switch array 12, with the analog input voltage value Vin which is held in the sampling period. Then, at a falling time of the lower-order comparison signal from the control signal generating circuit 9, the respective voltage comparators 6 output lower-order voltage comparison results C0F, C1F and C2F as comparison results. Thereafter, on the receipt of the lower-order voltage comparison results C0F, C1F and C2F, a lower-order code selecting circuit 17 converts these comparison results into lower-order code selection signals P0F, P1F, P2F and P3F, and a lower-order coding circuit 18 outputs a two-bit lower-order binary code in accordance with the lower-order code selection signals P0F, P1F, P2F and P3F.

Then, a code compositing circuit 19 performs a logic operation on the two-bit higher-order binary code output from the higher-order coding circuit 15 and the two-bit lower-order binary code output from the lower-order coding circuit 18, to obtain a four-bit digital output from a digital output terminal 11.

As described above, according to the serial/parallel A/D converter of the third embodiment, under the control of the lower-order reference voltage initialization signal s9 generated in the control signal generating circuit 9, the higher-order code selecting circuit 7 outputs the higher-order code selection signals P0C–P3C to the higher-order coding circuit 15 as well as outputs the initialization voltage selection signals s10–s13 for fixing the on/off state of the lower-order reference voltage selection switch 5 in a prescribed state, to the reference resistor and switch array 12 in the initialization period. On the other hand, in the periods other than the initialization period, the higher-order code selecting circuit 7 outputs the higher-order code selection signals P0C–P3C and the initialization voltage selection signals s10–s13 having the same values as those of the higher-order code selection signals P0C–P3C to the higher-order coding circuit 15 and the reference resistor and switch array 12, respectively. Therefore, even when the analog input voltage Vin greatly varies in a period from a previous sampling period to the next sampling period and, accordingly, the lower-order reference voltages Vr1f, Vr2f and Vr3f are greatly varied, the value of the lower-order reference voltage can be initialized to a prescribed voltage value on the basis of the initialization voltage selection signals s10–s13 before the lower-order reference voltage is decided in the reference resistor and switch array 12 on the basis of the comparison results from the high comparator array 13, and then the value of the lower-order reference voltage can be changed from the prescribed value to the value of a new lower-order reference voltage in the lower-order reference voltage decision period, resulting in a small amount of variation of the lower-order reference voltages in the lower-order reference voltage decision period. Accordingly, it is possible to prevent the conventional problem that the lower-order reference voltages Vr1f, Vr2f and Vr3f are not stabilized even in the lower-order comparison period, whereby a serial/parallel A/D converter that is able to perform a high-speed and high-accuracy operation even when the analog input voltage Vin greatly varies can be realized.

In the third embodiment, the initialization of the lower-order reference voltage can be performed without a lower-order reference voltage initializing circuit for initializing the lower-order reference voltage, thereby more simplifying the construction of the serial/parallel A/D converter.

In the third embodiment, the description has been given of the four-bit serial/parallel A/D converter which performs a logic operation on higher-order two bits and lower-order two bits, while the number of bits of the digital output generated in the serial/parallel A/D converter can be set arbitrarily, and the number of higher-order bits and lower-order bits can be also set arbitrarily.

Further, in the third embodiment, the serial/parallel A/D converter has a two-level construction, and performs a logic operation on higher-order two bits and lower-order two bits to obtain a four-bit digital output, while the serial/parallel A/D converter does not need to have a two-level construction, and may have an arbitrary multiple-level construction.

Figure 10:
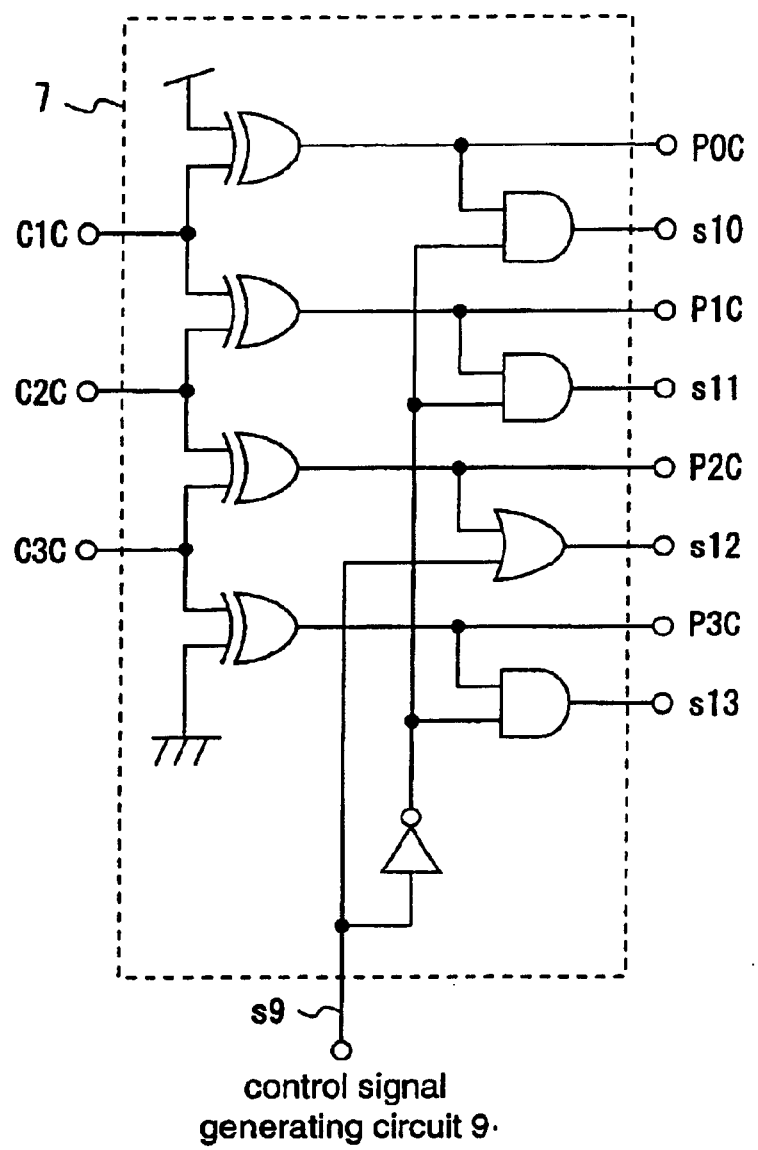
FIG. 10 is a diagram illustrating a construction of a higher-order code selecting circuit of the serial/parallel A/D converter according to the third embodiment of the invention.

Furthermore, while in the third embodiment the higher-order code selecting circuit 7 comprises the exclusive-OR circuits, the OR circuit, and the AND circuits as shown in FIG. 10, the higher-order code selecting circuit 7 may comprise other logic circuits.

In the third embodiment, the description has been given of the case where the control signal generating circuit 9 is constructed as shown in FIG. 3, and the initialization period is the sampling period, while the same effects can be achieved when the control signal generating circuit is constructed as shown in FIG. 7, and the initialization period is the higher-order comparison period. Further, while the lower-order reference voltage is initialized when the logical level of the lower-order reference voltage initialization signal s9 is high, the logical level is determined arbitrarily.

What is claimed is:

1. An A/D conversion method for a serial/parallel A/D converter which compares an analog input voltage which randomly varies with time and a prescribed first reference voltage, to generate a first binary code, as well as compares a second reference voltage which is decided on the basis of the result of the comparison and the analog input voltage, to generate a second binary code, and performs a logic operation on the generated first and second binary codes, thereby generating a digital value, said method comprising:

a sampling and initialization step of sampling the analog input voltage received, as well as initializing a previous second reference voltage to a prescribed initialization voltage;

a first voltage comparison step of comparing the value of the analog input voltage which has been sampled in the sampling and initialization step and the first reference voltage, to generate the first binary code; and a second voltage comparison step of comparing the value of the second reference voltage which has been changed from the prescribed initialization voltage to a voltage which is decided on the basis of the result of the comparison in the first voltage comparison step, with the value of the analog input voltage which has been sampled in the sampling and initialization step, to generate the second binary code.

2. An A/D conversion method for a serial/parallel A/D converter which compares an analog input voltage which randomly varies with time and a prescribed first reference voltage, to generates a first binary code, as well as compares a second reference voltage which is decided on the basis of the result of the comparison, and the analog input voltage, to generates a second binary code, and performs a logic operation on the generated first and second binary codes, thereby generating a digital value, said method comprising:

a sampling step of the sampling analog input voltage received;

a first voltage comparison and initialization step of comparing the analog input voltage which has been sampled in the sampling step and the first reference voltage, and initializing a previous second reference voltage to a prescribed initialization voltage, to generate the first binary code; and a second voltage comparison step of comparing the second reference voltage which has been changed from the prescribed initialization voltage to a voltage value which is decided on the basis of the result of the comparison in the first voltage comparison and initialization step, and the analog input voltage which has been sampled in the sampling step, to generate the second binary code.

3. An A/D conversion method for a serial/parallel A/D converter which compares an analog input voltage which randomly varies with time and a prescribed first reference voltage, to generate a first binary code, as well as repeatedly compares a reference voltage which is decided on the basis of the result of the comparison and the analog input voltage to generate a binary code, thereby generating second to n-th ("n" is an integer satisfying n≧3) binary codes, and performs a logic operation on the generated first to n-th binary codes, thereby generating a digital value, said method comprising steps of:

sampling the analog input voltage received, as well as initializing previous second to n-th reference voltages to a prescribed initialization voltage; and carrying out an m-th voltage comparison step ("m" is an integer satisfying 1≦m<n) of comparing the value of the analog input voltage which has been sampled in the sampling and initialization step and the m-th reference voltage, to generate the m-th binary code, and an (m+1)-th voltage comparison step of comparing the value of the (m+1)-th reference voltage which has been changed from the prescribed initialization voltage to a voltage value which is decided on the basis of the result of the comparison in the m-th voltage comparison step and the value of the analog input voltage which has been sampled in the sampling and initialization step, to generate the (m+1)-th binary code, from m=1 to m=n−1.

4. An A/D conversion method for a serial/parallel A/D converter which compares an analog input voltage which randomly varies with time and a prescribed first reference voltage, to generate a first binary code, as well as repeatedly compares a reference voltage which is decided on the basis of the result of the comparison and the analog input voltage to generate a binary code, thereby generating second to n-th ("n" is an integer satisfying n≧3) binary codes, and performs a logic operation on the generated first to n-th binary codes, thereby generating a digital value, said method comprising steps of:

sampling the analog input voltage received; and carrying out an m-th voltage comparison and initialization step ("m" is an integer satisfying 1≦m<n) of comparing the value of the analog input voltage which has been sampled in the sampling step and the m-th reference voltage, as well as initializing a previous (m+1)-th reference voltage to a prescribed initialization voltage, to generate the m-th binary code, and an (m+1)-th voltage comparison step of comparing the value of the (m+1)-th reference voltage which has been changed from the prescribed initialization voltage to a voltage value which is decided on the basis of the result of the comparison in the m-th voltage comparison and initialization step and the value of the analog input voltage which has been sampled in the sampling step, to generate the (m+1)-th binary code, from m=1 to m=n−1.

5. A serial/parallel A/D converter for converting an analog input voltage into a digital value, comprising:

a reference resistor and switch array which is constituted by a resistor array comprising plural resistors which are serially connected, and plural switches connected to plural connection points of the resistor array, for selectively outputting a reference voltage which is compared with the analog input voltage that randomly varies with time;

a first voltage comparator array for sampling the analog input voltage received, and comparing the sampled analog input voltage and a first reference voltage which is output from the reference resistor and switch array, to output a first comparison result;

a first code selecting circuit which receives the first comparison result output from the first voltage comparator array, and outputs a first code selection signal;

a first coding circuit which outputs a first binary code that is selected in accordance with the first code selection signal output from the first code selecting circuit;

a second voltage comparator array for sampling the analog input voltage received, and comparing the sampled analog input voltage and a second reference voltage which is selectively output by the plural switches constituting the reference resistor and switch array in accordance with the first code selection signal, to output a second comparison result;

a second code selecting circuit which receives the second comparison result output from the second voltage comparator array, and outputs a second code selection signal;

a second coding circuit which outputs a second binary code which is selected in accordance with the second code selection signal output from the second code selecting circuit; and a code compositing circuit which performs a logic operation on the first binary code and the second binary code, to obtain a digital value, wherein said second voltage comparator array samples the received analog input voltage, receives and holds a prescribed initialization voltage in an arbitrary period of time, and compares the value of the second reference voltage which has been changed from the prescribed initialization voltage to a voltage value which is selectively output by the plural switches constituting the reference resistor and switch array in accordance with the first code selection signal, and the value of the sampled analog input voltage.

6. The serial/parallel A/D converter of claim 5 wherein the initialization voltage is a reference voltage which is output from one of the plural connection points of the resistor array constituting the reference resistor and switch array.

7. The serial/parallel A/D converter of claim 5 further including:

a reference voltage initializing circuit which receives the second reference voltage output from the reference resistor and switch array, the initialization voltage, and an initialization control signal indicating the arbitrary period, and outputs either the second reference voltage or the prescribed voltage to the second voltage comparator array in accordance with the initialization control signal, wherein said reference voltage initializing circuit outputs the initialization voltage in the arbitrary period, while outputting the second reference voltage which is output from the reference resistor and switch array in periods other than the arbitrary period.

8. The serial/parallel A/D converter of claim 5 wherein said first code selecting circuit receives an initialization control signal indicating the arbitrary period, as well as the first comparison result output from the first voltage comparator array, and in the arbitrary period, the first code selection signal is output to the first coding circuit, as well as an initialization voltage selection signal for selecting the prescribed initialization voltage by fixing predetermined switches among the plural switches constituting the reference resistor and switch array in on-state while fixing all other switches in off-state is output to the reference resistor and switch array, and in periods other than the arbitrary period, the first code selection signal is output to the first coding circuit and the reference resistor and switch array.

9. The serial/parallel A/D converter of claim 5 wherein said arbitrary period is a period during which the analog input voltage input is sampled in the first and second voltage comparator arrays.

10. The serial/parallel A/D converter of claim 5 wherein said arbitrary period is a period during which the first voltage comparator array compares the analog voltage value and the first reference voltage which is output from the reference resistor and switch array, and outputs the first comparison result.

11. A serial/parallel A/D converter for converting an analog input voltage into a digital value, comprising:

a reference resistor and switch array which is constituted by a resistor array comprising plural resistors which are serially connected, and plural switches connected to plural connection points of the resistor array, for selectively outputting a reference voltage which is compared with the analog input voltage that randomly varies with time;

a first voltage comparator array for sampling the analog input voltage received, and comparing the sampled analog input voltage and a first reference voltage which is output from the reference resistor and switch array, to output a first comparison result;

second to n-th voltage comparator arrays for sampling the analog input voltage received, and comparing the sampled analog input voltage and second to n-th reference voltages which are generated in the reference resistor and switch array on the basis of comparison results from the first to (n−1)-th ("n" is an integer satisfying $n \geq 3$) voltage comparator arrays, respectively, to output second to n-th comparison results, respectively;

first to n-th code selecting circuits which receive the first to n-th comparison results output from the first to n-th voltage comparator arrays, respectively, and output first to n-th code selection signals, respectively;

first to n-th coding circuits which output first to n-th binary codes which are selected in accordance with the first to n-th code selection signals output from the first to n-th code selecting circuits, respectively; and a code compositing circuit which performs a logic operation on the first to n-th binary codes output from the first to n-th coding circuits, to obtain a digital value, wherein each of said second to n-th voltage comparator arrays samples the analog input voltage, receives and holds a prescribed initialization voltage in an arbitrary period of time, and compares each value of the second to n-th reference voltages which has been changed from the prescribed initialization voltage to a voltage value that is selectively output by the plural switches constituting the reference resistor and switch array adaptively to the respective first to (n−1)-th code selection signals, with the value of the sampled analog input voltage.

* * * * *